(12) United States Patent
Asai et al.

(10) Patent No.: US 8,309,434 B2
(45) Date of Patent: Nov. 13, 2012

(54) METHOD FOR MANUFACTURING SEMICONDUCTOR DEVICE INCLUDING SEMICONDUCTOR ELEMENTS WITH ELECTRODE FORMED THEREON

(75) Inventors: Yasutomi Asai, Okazaki (JP); Hiroshi Ishino, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/923,313

(22) Filed: Sep. 14, 2010

(65) Prior Publication Data
US 2011/0033975 A1    Feb. 10, 2011

Related U.S. Application Data

(62) Division of application No. 11/806,340, filed on May 31, 2007, now abandoned.

(30) Foreign Application Priority Data

Jun. 5, 2006 (JP) ................................. 2006-155732
Apr. 3, 2007 (JP) ................................. 2007-097453

(51) Int. Cl.
H01L 21/46 (2006.01)
H01L 21/78 (2006.01)
H01L 21/301 (2006.01)

(52) U.S. Cl. .. 438/462; 438/465; 438/598; 257/E21.523

(58) Field of Classification Search .................. 257/620, 257/797, E21.523; 438/462, 465, 598
See application file for complete search history.

(56) References Cited

U.S. PATENT DOCUMENTS

| | | | |
|---|---|---|---|
| 5,237,199 A * | 8/1993 | Morita ........................... | 257/638 |
| 5,300,806 A * | 4/1994 | McClurg ....................... | 257/594 |
| 5,532,512 A | 7/1996 | Fillion et al. | |
| 5,910,687 A * | 6/1999 | Chen et al. ..................... | 257/784 |
| 6,392,290 B1 | 5/2002 | Kasem et al. | |
| 6,642,615 B2 | 11/2003 | Hashimoto et al. | |
| 6,806,176 B2 | 10/2004 | Hashimoto et al. | |
| 6,853,066 B2 | 2/2005 | Hosoya | |
| 6,879,033 B2 | 4/2005 | Hosoya | |
| 6,882,040 B2 | 4/2005 | Hosoya | |
| 7,242,085 B2 | 7/2007 | Hosoya | |
| 2002/0027293 A1 | 3/2002 | Hoshino | |

(Continued)

FOREIGN PATENT DOCUMENTS

DE    10 2004 021 838 A1    9/2005

(Continued)

OTHER PUBLICATIONS

Office Action dated Jul. 30, 2009 from the German Patent Office for corresponding application No. 10 2007 025 950.8 (and English translation).

(Continued)

*Primary Examiner* — Ngan Ngo
(74) *Attorney, Agent, or Firm* — Posz Law Group, PLC

(57) ABSTRACT

A semiconductor device includes: a semiconductor element having first and second surfaces, wherein the semiconductor element includes at least one electrode, which is disposed on one of the first and second surfaces; and first and second metallic layers, wherein the first metallic layer is disposed on the first surface of the semiconductor element, and wherein the second metallic layer is disposed on the second surface of the semiconductor element. The one electrode is electrically coupled with one of the first and second metallic layers, which is disposed on the one of the first and second surfaces. The one electrode is coupled with an external circuit through the one of the first and second metallic layers.

2 Claims, 18 Drawing Sheets

U.S. PATENT DOCUMENTS

| | | |
|---|---|---|
| 2006/0138532 A1 | 6/2006 | Okamoto et al. |
| 2007/0210440 A1 | 9/2007 | Hosoya |
| 2007/0246808 A1 | 10/2007 | Ewe et al. |

FOREIGN PATENT DOCUMENTS

| | | |
|---|---|---|
| JP | A-S58-34951 | 3/1983 |
| JP | A-10-229097 | 8/1998 |
| JP | A-H10-303151 | 11/1998 |
| JP | A-H11-204700 | 7/1999 |
| JP | A-2001-135654 | 5/2001 |
| JP | A-2001-345336 | 12/2001 |
| JP | A-2003-46048 | 2/2003 |
| JP | A-2004-14811 | 1/2004 |

OTHER PUBLICATIONS

Office Action dated May 19, 2009 from the US Patent Office for corresponding U.S. Appl. No. 11/806,340.

Office Action dated Sep. 22, 2009 from the US Patent Office for corresponding U.S. Appl. No. 11/806,340.

Office Action dated Jan. 19, 2010 from the US Patent Office for corresponding U.S. Appl. No. 11/806,340.

Office Action dated Jul. 8, 2010 from the US Patent Office for corresponding U.S. Appl. No. 11/806,340.

Office Action mailed Feb. 7, 2012 issued in corresponding Japanese application No. 2007-097453 (English translation enclosed).

* cited by examiner

METHOD FOR MANUFACTURING SEMICONDUCTOR DEVICE INCLUDING SEMICONDUCTOR ELEMENTS WITH ELECTRODE FORMED THEREON

CROSS REFERENCE TO RELATED APPLICATIONS

This application is a divisional application of application No. 11/806,340, which was filed on May 31, 2007. This application is based on Japanese Patent Applications No. 2006-155732 filed on Jun. 5, 2006, and No. 2007-097453 filed on Apr. 3, 2007, the disclosures of which are incorporated herein by reference.

FIELD OF THE INVENTION

The present invention relates to a semiconductor device and a method for manufacturing the same.

BACKGROUND OF THE INVENTION

As the semiconductor device of this kind, for example, it is formerly general that the semiconductor element having electrodes on both the front and rear faces is mounted to a heat sink, and a face of a side opposed to the heat sink in the semiconductor element is connected to a lead frame through a bonding wire.

In such a construction, each of the heat sink, the bonding wire and the lead frame is constructed as a connecting member for electrically taking-out the electrode of the semiconductor element to the exterior. The electrode of each of the front and rear faces in the semiconductor element is taken out to the exterior through these connecting members.

However, after the semiconductor element is cut out of a semiconductor wafer in a chip unit, such a former semiconductor device is formed by mounting the semiconductor element onto the heat sink and performing wire bonding. Therefore, a manufacturing process is complicated. Further, since a construction for connecting the bonding wire to the lead frame is adopted, the problem that the size of the device becomes larger than that of the semiconductor element is also caused.

In this connection, a method for sticking insulating plates to both faces of the wafer with respect to the semiconductor element of a wafer state and then cutting these in a chip unit (e.g., in JP-A-2001-135654) is formerly proposed.

However, in the method for sticking the insulating plates to both the faces of such a semiconductor element, no electrode can be taken out of both the front and rear faces in the semiconductor element having the electrodes on both the front and rear faces.

Further, in the case of the semiconductor element having the electrode on only one face of both the front and rear faces of the chip, the electrode is similarly taken out through the bonding wire and the lead frame in the construction of the above former semiconductor device. Therefore, the problem of increasing the size of the device including these is similarly generated.

It is required for a semiconductor device to manufacture by a simple process and to minimize the dimensions of the semiconductor device, the device made of semiconductor and having an electrode on at least one face of the device, and electrically connected to an external element.

SUMMARY OF THE INVENTION

In view of the above-described problem, it is an object of the present disclosure to provide a semiconductor device. It is another object of the present disclosure to provide a method for manufacturing a semiconductor device.

According to a first aspect of the present disclosure, a semiconductor device includes: a semiconductor element having first and second surfaces, wherein the semiconductor element includes at least one electrode, which is disposed on one of the first and second surfaces; and first and second metallic layers, wherein the first metallic layer is disposed on the first surface of the semiconductor element, and wherein the second metallic layer is disposed on the second surface of the semiconductor element. The one electrode is electrically coupled with one of the first and second metallic layers, which is disposed on the one of the first and second surfaces. The one electrode is coupled with an external circuit through the one of the first and second metallic layers.

The above device is easily manufactured by sandwiching the semiconductor element between the first and second metallic layers. Further, the device is minimized appropriately since the dimensions of the device are substantially equal to the dimensions of the semiconductor element.

According to a second aspect of the present disclosure, a semiconductor device includes: a semiconductor element having first and second surfaces, wherein the semiconductor element has a first electrode, which is disposed on the first surface; and a first metallic layer disposed on the first surface of the semiconductor element. The first electrode is electrically coupled with the first metallic layer so that the first electrode is coupled with an external circuit through the first metallic layer.

The above device is easily manufactured by bonding the first metallic layer to the first surface of the semiconductor element. Further, the device is minimized appropriately since the dimensions of the device are substantially equal to the dimensions of the semiconductor element.

According to a third aspect of the present disclosure, a method for manufacturing a semiconductor device includes: preparing a semiconductor wafer having a plurality of semiconductor elements, wherein each semiconductor element includes at least one electrode, which is disposed on one of first and second surfaces of the semiconductor element; forming first and second metallic layers on first and second surfaces of the semiconductor wafer, respectively; and dividing the semiconductor wafer together with the first and second metallic layers into a plurality of semiconductor element chips.

The above method provides the semiconductor device, which is easily manufactured by bonding the first metallic layer to the first surface of the semiconductor element. Further, the device is minimized appropriately since the dimensions of the device are substantially equal to the dimensions of the semiconductor element.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS (First Embodiment Mode)

Figure 1:
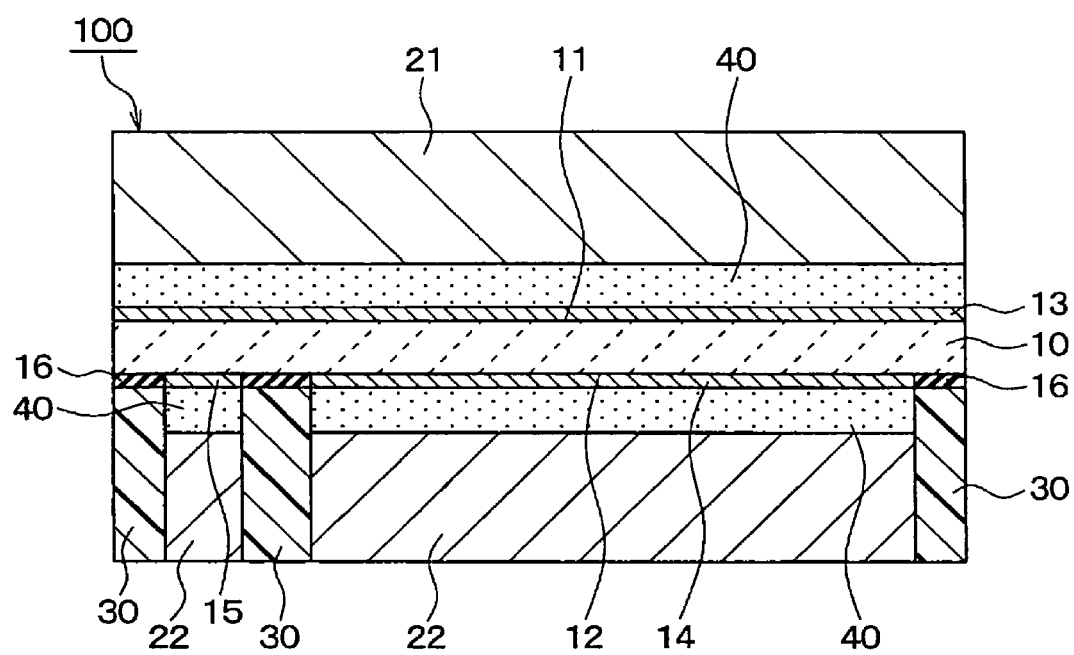
FIG. 1 is a cross sectional view showing a semiconductor device according to a first embodiment.

FIG. 1 is a schematic sectional view showing the entire construction of a semiconductor device 100 in accordance with a first embodiment mode. Here, an upper face 11 of a semiconductor element 10 in the semiconductor device 100 within FIG. 1 is set to a front face 11, and a lower face 12 is set to a rear face 12.

Figure 2A:
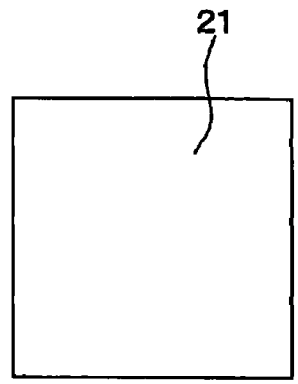
FIG. 2A is a plan view showing a foreside metal layer in the device.
Figure 2B:
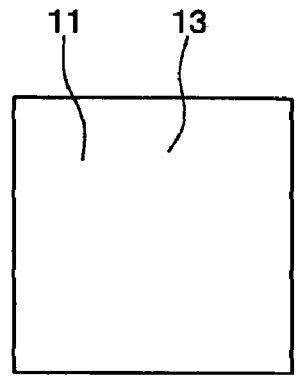
FIG. 2B is a plan view showing a foreside electrode in the device.
Figure 2C:
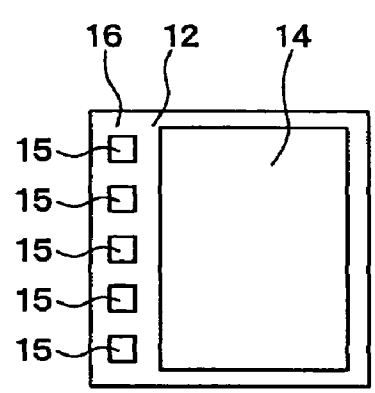
FIG. 2C is a plan view showing a backside electrode in the device.
Figure 2D:
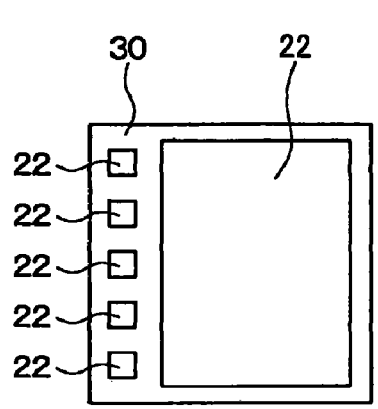
FIG. 2D is a plan view showing a backside metal layer and a resin mold in the device.

Further, FIG. 2A is a plan view of a front face side metallic layer 21 as a metallic layer on a front face 11 side of the semiconductor element 10 within FIG. 1. FIG. 2B is a view showing a planar shape of an electrode 13 on the front face 11 side of the semiconductor element 10. FIG. 2C is a view showing a planar shape of electrodes 14, 15 of a rear face 12 side of the semiconductor element 10. FIG. 2D is a view showing planar shapes of a rear face side metallic layer 22 as a metallic layer on the rear face 12 side of the semiconductor element 10 and resin 30. In FIG. 2D, for convenience, hatching is performed on the front face of the resin 30 to discriminate the rear face side metallic layer 22 and the resin 30.

The semiconductor device 100 of this embodiment mode has the semiconductor element 10 constructed by a semiconductor and having electrodes 13, 14, 15 on both front and rear faces 11, 12. A semiconductor switching element for electric power, a so-called power element, an element of normal LSI, a transistor, a diode, etc. are enumerated as such a semiconductor element 10.

Concretely, such a semiconductor element 10 is manufactured by using a publicly known semiconductor process in a semiconductor wafer of silicon, etc., and is also manufactured by performing dicing cut. The normal size of the power element used as the semiconductor element 10 is about 10 mm×10 mm (square of 10 mm on one side) and is about 0.1 mm in thickness.

In this example, the semiconductor element 10 is IGBT (Insulated Gate Bipolar Transistor) constructed by a silicon chip, and is about 50 to 200 μm in thickness.

As shown in FIGS. 2A to 2D, one electrode 13 of about the same extent as the area of the chip is arranged on the front face 11 of the semiconductor element 10 of this example. This electrode 13 is a collector electrode 13 in IGBT constructed by aluminum, etc.

On the other hand, as shown in FIGS. 2A to 2D, electrodes 14, 15 constructed by aluminum, etc. are also arranged on the rear face 12 of the semiconductor element 10 of this example. The electrodes 14, 15 of this rear face side are constructed by plural divided electrodes.

Here, the plural electrodes 14, 15 are an emitter electrode 14 and a gate electrode 15 in IGBT. In FIG. 2C, the emitter electrode 14 is shown as one comparatively large planar rectangular shape, and the collector electrode 15 is shown as plural comparatively small planar rectangular shapes.

Further, as shown in FIGS. 1 and 2C, a protecting film 16 of an electric insulating property is arranged in a part except for an arranging part of the electrodes 14, 15 of the rear face side on the rear face 12 of the semiconductor element 10.

For example, this protecting film 16 is constructed by resin of polyimide, polyamide, etc. Thus, exposure of a silicon portion in the semiconductor element 10 is prevented, and increases of strength and withstand voltage of the element are intended.

Further, this protecting film 16 also has a function for securing a close attaching property to the resin 30. These detailed construction and operation of the semiconductor element 10 as IGBT are publicly known, and are therefore omitted here.

The front face side metallic layer 21 and the rear face side metallic layer 22 are respectively connected to the front face 11 and the rear face 12 of this semiconductor element 10. These metallic layers 21, 22 are constructed by a metal excellent in characteristics of electric conductivity, thermal conductivity, etc.

If the above characteristics are considered, Cu is desirable as such metallic layers 21, 22, but brass, bronze, iron, Ni, iron Ni alloy, Mo (molybdenum), etc. may be also used. In this example, the metallic layers 21, 22 have a plate shape constructed by Cu, and both their thicknesses are about 0.15 mm.

Further, when reliability of the semiconductor element 10 is considered, Mo, W, Ni alloy, etc. of small thermal expansion are desirable as the materials of the metallic layers 21, 22. Further, when this semiconductor device 100 is mounted onto a print substrate and reliability of its mounting is considered, Cu, etc. having a thermal expansion coefficient close to that of the print substrate are desirable as the materials of the metallic layers 21, 22.

As shown in FIG. 1, the respective metallic layers 21, 22 are electrically connected to electrodes 13 to 15 on the respective front and rear faces 11, 12 of the semiconductor element 10. In this embodiment mode, the electric connection of the front face side metallic layer 21 and the collector electrode 13, and the electric connection of the rear face side metallic layer 22, the emitter electrode 14 and the gate electrode 15 are made through an electrical conductive joining member 40.

It is sufficient to use a member able to secure an electrical conductive property and an adhesive property as this electrical conductive joining member 40. Concretely, solder, a brazing material, or an electrical conductive adhesive, an anisotropic electrical conductive film, etc. are enumerated. In this example, solder 40 is used as the electrical conductive joining member 40.

Low melting point solder such as eutectic crystal solder, etc. may be also used as this solder 40. However, solder having a melting point of 250° C. or more, preferably 300° C. or more such as Sn—Ni system solder, etc. is preferable. This is because no solder 40 is again melted when this semiconductor device 100 is mounted to a substrate, etc. later by soldering (see FIGS. 5A, 5B and 6A, 6B described later).

Since the respective electrodes 13 to 15 of the semiconductor element 10 are connected to the metallic layers 21, 22 by the solder 40 in this way, surface processing able to perform soldering is performed on the surfaces of these respective electrodes 13 to 15. For example, Ni, Cu, Au plating, etc. are performed on the surfaces of the respective electrodes 13 to 15 constructed by aluminum.

Here, on the front face 11 side of the semiconductor element 10, the front face side metallic layer 21 is also set to the size of the same extent correspondingly to one large collector electrode 13. In this example, as shown in FIGS. 2A to 2D, the front face side metallic layer 21 has a planar rectangular shape having about the same size as the collector electrode 13 of a planar rectangular shape.

Further, the electrodes 14, 15 are formed by plural electrodes on the rear face 12 side of the semiconductor element 10. Therefore, the rear face side metallic layer 22 connected to these plural electrodes 14, 15 is constructed by plural dividing portions divided so as to form patterns corresponding to arranging patterns of the plural electrodes 14, 15.

In this example, as shown in FIGS. 2C and 2D, the rear face side metallic layer 22 is constructed by portions divided in large and small rectangular shapes correspondingly to the plural electrodes 14, 15 of the rear face 12 side. These dividing portions are electrically connected to the respective electrodes 14, 15 of the rear face side through the solder 40.

Thus, the collector electrode 13 of the front face 11 side of the semiconductor element 10 can be connected to the exterior through the front face side metallic layer 21. On the other hand, the emitter electrode 14 and the gate electrode 15 of the rear face 12 side can be connected to the exterior through the rear face side metallic layer 22. Namely, the respective electrodes 13 to 15 can be taken out to the exterior through the respective metallic layers 21, 22.

Further, as shown in FIGS. 1 and 2A to 2D, a portion between the individual dividing portions in the rear face side metallic layer 22 as this divided metallic layer is sealed by the resin 30.

This resin 30 bears roles of short-circuit prevention between the respective dividing portions, protection of the semiconductor element 10, etc., and is constructed by e.g., epoxy system resin, etc. Hereinafter, the resin 30 for sealing a portion between the dividing portions in this rear face side metallic layer 22 is called seal resin 30.

Here, the thickness of the semiconductor element 10 and the thicknesses of the metallic layers 21, 22 will be further described.

The thickness of the semiconductor element 10 may be set to an arbitrary thickness, but is particularly desirably set to 0.1 mm or less to relax thermal stress at an assembly time, i.e., a soldering time of the metallic layers 21, 22 and the semiconductor element 10, and raise a characteristic change and reliability of the semiconductor element 10 when the semiconductor is silicon.

If the thickness of the semiconductor element 10 is 0.1 mm or less, the semiconductor element 10 can be contracted by comparatively low stress with respect to thermal behavior of the metallic layers 21, 22. Further, there is a high possibility that an influence of the thicknesses of the metallic layers 21, 22 is small.

Further, it is desirable that the thickness of the front face side metallic layer 21 is set to be equal to or smaller than the thickness of the semiconductor element 10, and the thickness of the rear face side metallic layer 22 is set to be equal to or smaller than the thickness of the semiconductor, element 10. This is because it is preferable that no semiconductor element 10 is contracted when there is a comparatively fragile film such as a silicon nitride film, a silicon oxide film, etc. on the semiconductor element 10.

If both the respective thicknesses of both the metallic layers 21, 22 located on both the front and rear faces 11, 12 of the semiconductor element 10 are set to the thickness of the semiconductor element 10 or less in this way, deformation of the semiconductor element 10 due to thermal expansion, etc. of the metallic layers 21, 22 at a heating time can be restrained.

Further, when the front face side metallic layer 21 and the rear face side metallic layer 22 are constructed by the same material as in copper of this example, it is desirable to set the thickness of the front face side metallic layer 21 and the thickness of the rear face side metallic layer 22 to be equal to each other.

When both the metallic layers 21, 22 located on both the front and rear faces 11, 12 of the semiconductor element 10 are constructed by the same material in this way, a warp of the semiconductor element 10 due to thermal expansion, etc. of the metallic layers 21, 22 at the heating time can be reduced if the thicknesses of both these metallic layers 21, 22 are equal to each other.

When both the metallic layers 21, 22 are constructed materials different from each other, it is desirable to design both the metallic layers 21, 22 to thicknesses for warping no semiconductor element 10 in consideration of its thermal contraction ratio and Young's modulus.

Next, the manufacturing method of the semiconductor device of this embodiment mode will be described with reference to FIGS. 3A to 3D and 4A to 4C. FIGS. 3A to 3D are process views showing this manufacturing method. FIGS. 4A to 4C are process views of this manufacturing method subsequent to FIGS. 3A to 3D, and sectionally show a work supplied to each process.

Figure 3A:
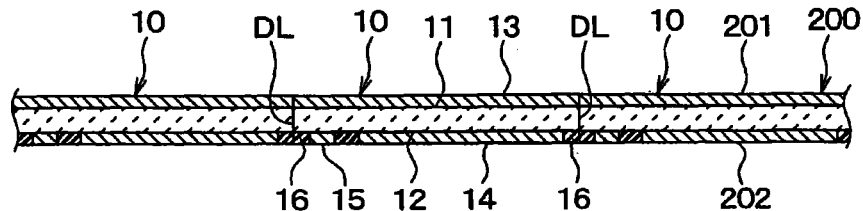
FIGS. 3A to 3D are cross sectional views showing a method for manufacturing the semiconductor device.
Figure 4A:
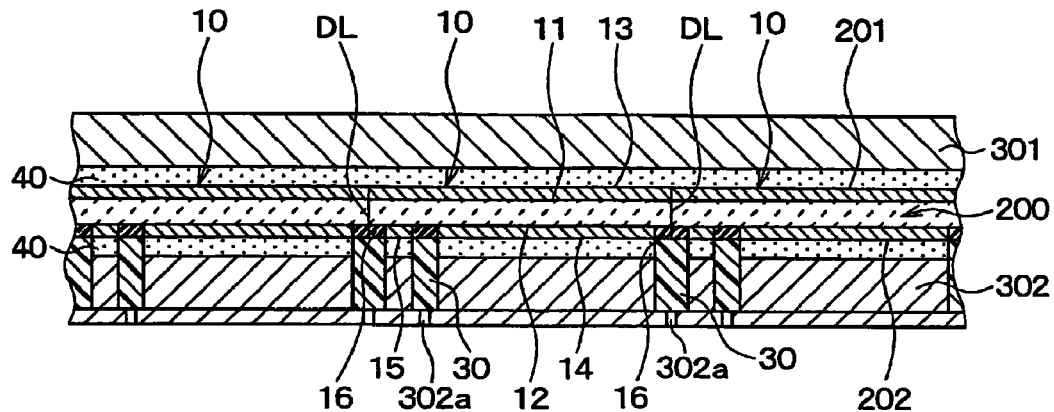
FIGS. 4A to 4C are cross sectional views showing the method for manufacturing the device.
Figure 4B:
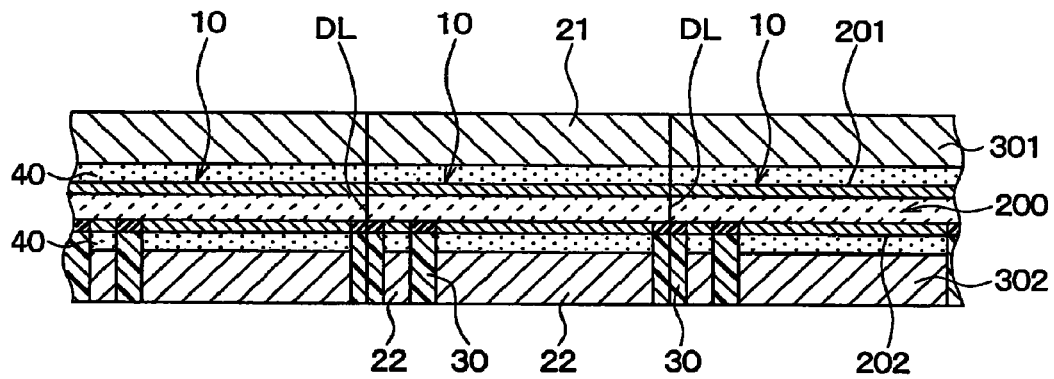
Figure 4C:
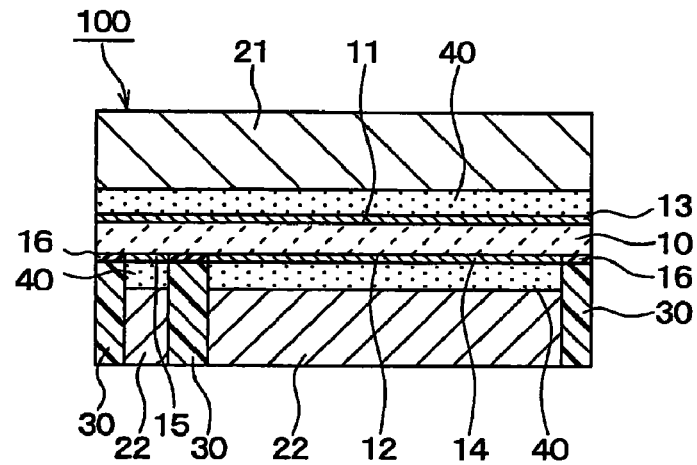

First, as shown in FIG. 3A, a semiconductor wafer 200 having plural semiconductor elements 10 each having electrodes 13 to 15 on both the front and rear faces 11, 12 and manufactured by a semiconductor process is prepared. This semiconductor wafer 200 is the semiconductor element 10 of a wafer state. A front face 201 and a rear face 202 of the wafer 200 are conformed to the front face 11 and the rear face 12 of the semiconductor element 10.

In this wafer 200, a portion finally divided is shown as a dicing line DL as a phantom line. In the semiconductor wafer 200, plural semiconductor elements 10 partitioned by this dicing line DL are formed.

In the individual semiconductor element 10, respective electrodes 13 to 15 are formed on the front face 11 and the rear face 12, and the above protecting film 16 is formed on the rear face 12. Further, plating processing for improving a soldering property as mentioned above is performed on the surface of each of the electrodes 13 to 15.

Next, the above metallic layers 21, 22 are connected to the respective faces of the front face 201 and the rear face 202 of this semiconductor wafer 200. Here, in this example, as shown in FIG. 3B, a plate material 301 as a copper plate having flat faces on its both faces is used as a raw material of the front face side metallic layer 21.

On the other hand, a metallic layer divided correspondingly to the arranging patterns of the plural electrodes 14, 15 of the rear face 12 side of the semiconductor element 10, i.e., the divided copper plate in this example is connected and formed on the rear face 202 of the wafer 200 as the rear face side metallic layer 22. The raw material of this divided copper plate, i.e., a plate material 302 constituting the raw material of the rear face side metallic layer 22 is shown in FIG. 3B.

Figure 3B:
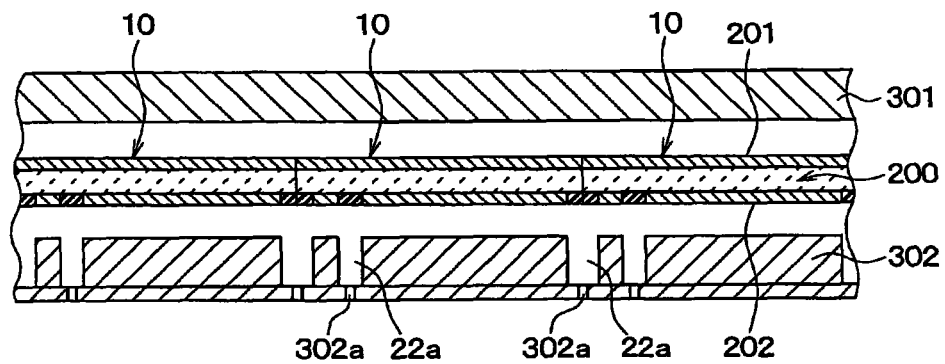

As shown in FIG. 3B, this plate material 302 is a copper plate in which a concave portion 22a is formed on a connecting face to the wafer 200 by half etching or press working, etc. and is hollowed until an intermediate portion of the thickness direction from this connecting face.

A planar pattern of this concave portion 22a is conformed to a dividing pattern of the rear face side metallic layer 22 as shown in the above FIGS. 2A to 2D. Namely, a dividing portion of the rear face side metallic layer 22 is demarcated by this concave portion 22a, and attains a state connected by a portion of a bottom portion side of the concave portion 22a.

Further, in the plate material 302 of this rear face side, a hole 302a for injecting the seal resin 30 to the concave portion 22a is formed in the bottom portion of the concave portion 22a by punching processing, etc. Further, this hole 302a also functions as a hole for venting gas generated within the concave portion 22a from the solder 40 in soldering performed later. The number of holes 302a, the shape, size of the hole 302a, etc. are arbitrary in a range able to show characteristics of the above hole 302a.

Figure 3C:
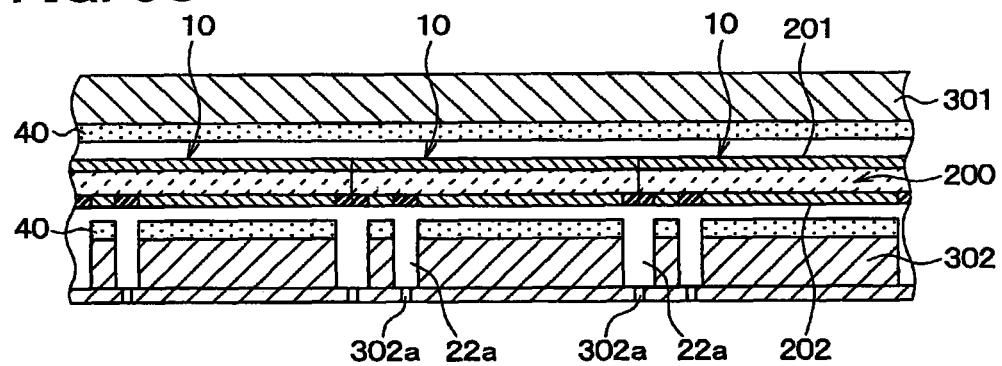

The plate materials 301, 302 as the raw materials of these metallic layers 21, 22 are then soldered to the semiconductor wafer 200. As shown in FIG. 3C, the solder 40 is arranged on a connecting face to the wafer 200 in each of the plate materials 301, 302.

Here, as a method for arranging the solder 40 in the plate materials 301, 302, for example, there is a method for performing solder plating in the plate materials 301, 302 as a copper plate.

This solder plating is not performed on only the connecting face to the wafer 200 in the plate materials 301, 302, but may be also performed on a face of a side opposed to this connecting face. However, it is desirable that no solder plating is performed on an inner face of the concave portion 22a, i.e., in a part coming in contact with the seal resin 30 in the plate material 302 as the rear face side metallic layer 22.

In addition to this, as a method for arranging the solder 40 in the plate materials 301, 302, there is a method for dipping the plate materials 301, 302 into a solder reservoir and performing soldering in addition to the above solder plating, and then removing a residue object of flux, etc. by washing, and a method for printing solder paste to the plate materials 301, 302 and then removing a residue object of reflow, flux, etc. by washing, etc.

Figure 3D:
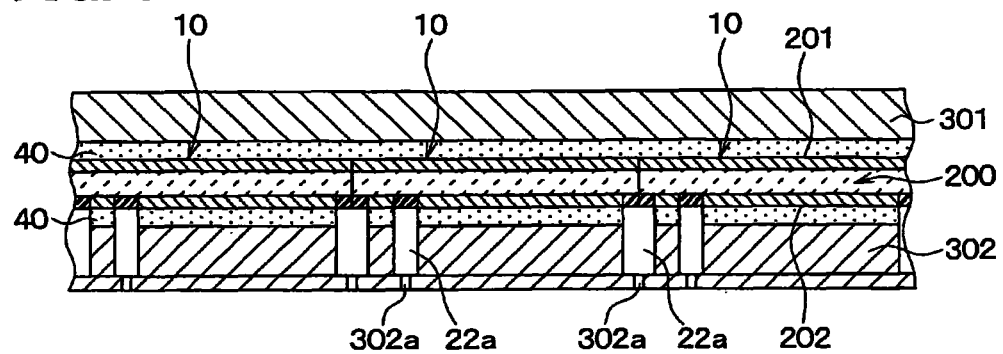

Thus, after the solder 40 is soldered to the connecting face of the plate materials 301, 302 to the wafer 200, the respective plate materials 301, 302 come in contact with the respective faces 201, 202 of the wafer 200 through the solder 40. As shown in FIG. 3D, soldering using reflow is performed. Thus, the plate materials 301, 302 are connected to both the front and rear faces 11, 12 of the semiconductor element 10, i.e., both the front and rear faces 201, 202 of the semiconductor wafer 200 through the solder 40.

In this solder reflow, a work is preferably nipped by a ceramic plate, etc. raised in a planar degree by polishing, etc. to prevent generation of a warp of the plate materials 301, 302 and the semiconductor wafer 200. Further, it is desirable to mount a weight and prevent the warp. Further, the reflow may be also performed after a vacuum is drawn and gas within the solder 40 is vented to reduce a solder void.

Next, after the connection of both the plate materials 301, 302 using this solder 40 is made, as shown in FIG. 4A, the seal resin 30 is injected into the concave portion 22a in the plate material 302 as the rear face side metallic layer through the above hole 302a by a transfer mold method, etc.

After the seal resin 30 is then hardened, as shown in FIG. 4B, a part of the bottom portion side of the concave portion 22a in the plate material 302 as the rear face side metallic layer is removed by polishing. Here, on a face of the side opposed to the connecting face in the plate material 302, the entire face of this opposed side is polished and removed by a plate thickness of the bottom portion of the concave portion 22a.

Thus, the concave portion 22a is opened to the face of the side opposed to the connecting face in the plate material 302, and a portion demarcated by the concave portion 22a is separated.

Thus, as this concave portion 22a is opened, it attains a state in which the front face side metallic layer 21 is connected on the front face 201 of the semiconductor wafer 200, and the rear face side metallic layer 22 as a divided metallic layer is connected on the rear face 202 side.

This polishing may be also performed with respect to the metallic layers 21, 22 of both the front and rear sides in addition to the rear face side metallic layer 22, and outer faces of both the metallic layers 21, 22 may be also flattened. After this polishing, solder plating, etc. are performed on outer faces of the metallic layers 21, 22 in accordance with necessity. For example, when the completed semiconductor device 100 is soldered and mounted onto a substrate, this solder plating is performed to improve solder wettability of the metallic layers 21, 22.

Subsequently, as shown in FIG. 4B, the semiconductor wafer 200 is cut in a unit of the semiconductor element 10 together with both the metallic layers 21, 22 along the dicing line DL. This cut can be performed by a normal dicing device.

Thus, the semiconductor wafer 200 becomes a chip formed as an individual piece together with both the metallic layers 21, 22, and the semiconductor device 100 of this embodiment mode is completed as shown in FIG. 4C.

In the above manufacturing method, when cut is performed along the dicing line, a material different from copper, silicon and the seal resin 30 mixedly exists in a cut portion. Here, in this dicing cut, a different material may be also cut by one blade, but the cut may be also performed by changing the blade every material.

Further, in the above manufacturing example, after the plate material 302 of the rear face side is soldered to the wafer 200, the seal resin 30 is injected from the above hole 302a into the concave portion 22a, but no timing of the injection of the seal resin 30 is limited to this case.

For example, the seal resin 30 may be also injected to the concave portion 22a of the plate material 302 of the rear face side in advance before the plate material 302 of the rear face side is soldered to the wafer 200. Thereafter, this injected object may be also connected to the wafer 200 through the solder 40.

Further, after the concave portion 22a is opened, the seal resin 30 may be also injected from this opening portion. In this case, no hole 302a in the above plate material 302 may be formed.

Further, in this case, there is a possibility that irregularities using the seal resin 30 are generated. Therefore, after the seal resin 30 is injected, it is preferable that the outer face of the plate material 302 of the rear face side is polished and flattened by also including the seal resin 30.

For example, the semiconductor device 100 of this embodiment mode manufactured in this way is mounted and used in a substrate, etc. as mentioned above. One example of a mounting mode to its substrate 400 is shown in FIGS. 5A, 5B and 6A, 6B.

Figure 5A:
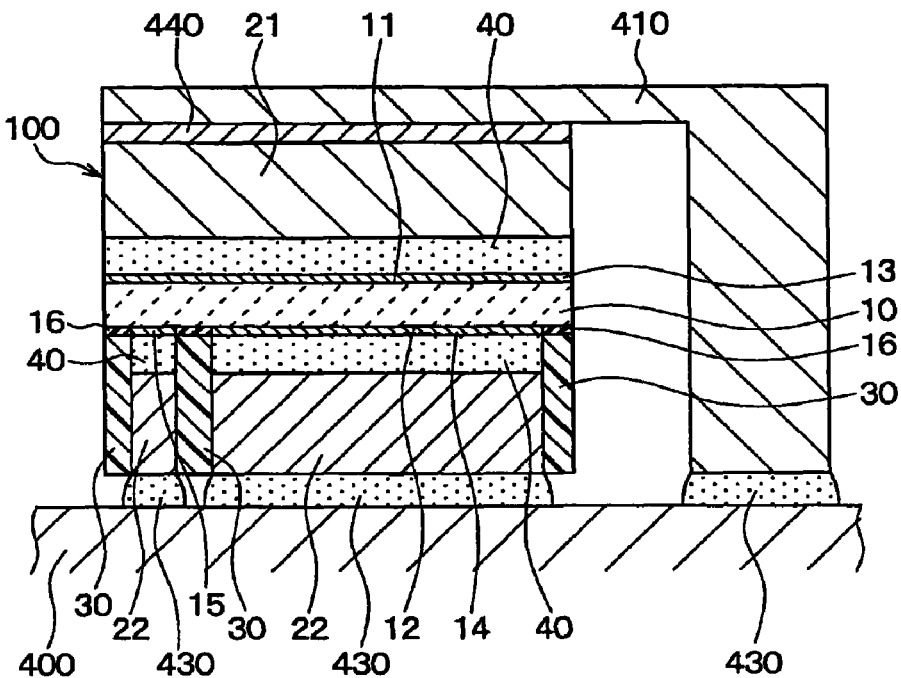
FIGS. 5A and 5B are cross sectional views showing the device mounted on a substrate in case of a lead.
Figure 5B:
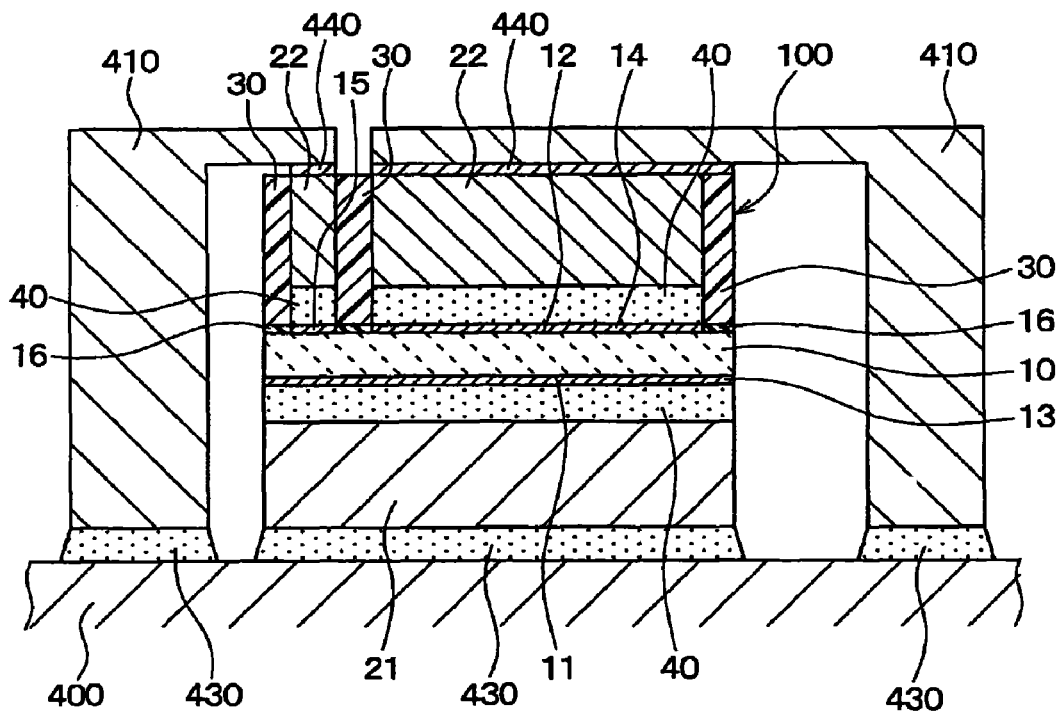
Figure 6A:
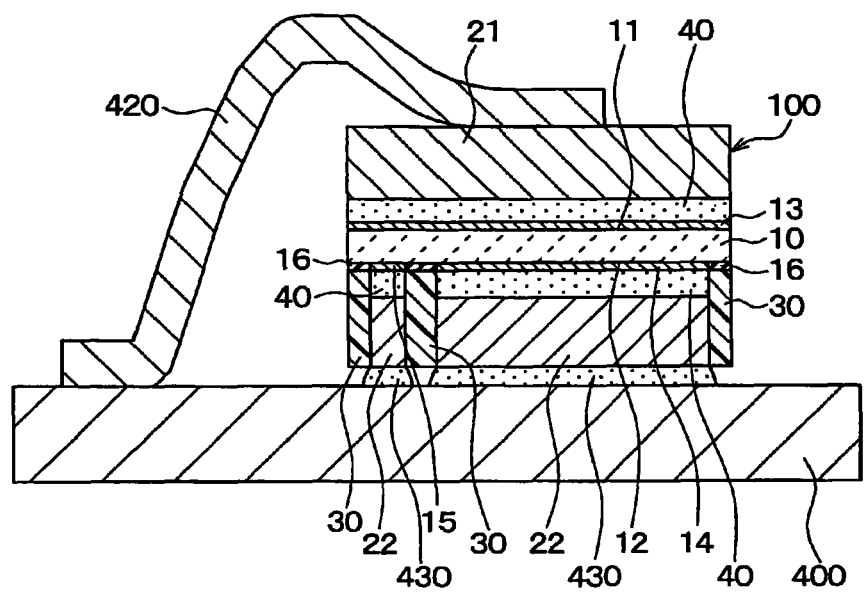
FIGS. 6A and 6B are cross sectional views showing the device mounted on a substrate in case of a bonding wire.
Figure 6B:
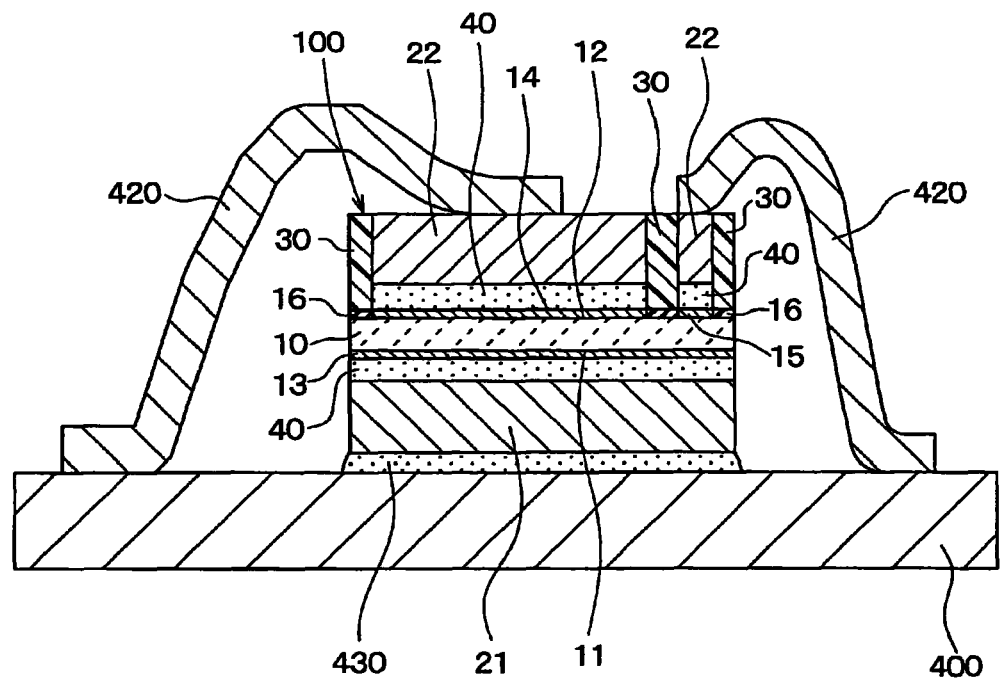

FIGS. 5A and 5B are schematic sectional views showing a mounting structure when a lead 410 manufactured by a metal is used. FIGS. 6A and 6B are schematic sectional views showing a mounting structure when a bonding wire 420 is used. Here, various kinds of wiring substrates such as a ceramic substrate, a print substrate, etc., or a metallic plate, etc. can be adopted as the substrate 400.

In an example shown in FIG. 5A, the semiconductor device 100 is mounted to the substrate 400 by directing the rear face side metallic layer 22 to the substrate 400. One end side of the rear face side metallic layer 22 and the lead 410 of the semiconductor device 100 is electrically and mechanically connected to the substrate 400 through e.g., solder 430.

The semiconductor device 100 is electrically connected to the lead 410 through solder 440 in the front face side metallic layer 21. Thus, electrodes 13 to 15 of the semiconductor element 10 in the semiconductor device 100 are taken out to the substrate 400 through the respective metallic layers 21, 22, the lead 410 and the solders 430, 440.

Further, in the example shown in FIG. 5B, the semiconductor device 100 is mounted to the substrate 400 by directing the front face side metallic layer 21 to the substrate 400 conversely to FIG. 5A.

The semiconductor device 100 is connected to the substrate 400 through the solder 430 in the front face side metallic layer 21, and is connected to the lead 410 through the solder 440 in the rear face side metallic layer 22. Here, plural leads 410 are arranged correspondingly to the emitter electrode 14 and the gate electrode 15.

In this example shown in FIG. 5B, similar to FIG. 5A, an electric taking-out path through the lead 410 is formed. The electric connection of this lead 410 and the metallic layers 21, 22 of the semiconductor device 100 is not limited to the solder 440, but may be also made by welding, brazing, etc.

Further, in the example shown in FIG. 6A, the semiconductor device 100 is connected to the substrate 400 through the solder 430 in the rear face side metallic layer 22, and the bonding wire 420 is connected in the front face side metallic layer 21.

Further, in the example shown in FIG. 6B, the semiconductor device 100 is connected to the substrate 400 through the solder 430 in the front face side metallic layer 21, and the bonding wire 420 is connected in the rear face side metallic layer 22. In these examples, the electrodes 13 to 15 of the semiconductor element 10 in the semiconductor device 100 are taken out to the substrate 400 through the respective metallic layers 21, 22, the wire 420 and the solder 430.

The semiconductor device 100 of this embodiment mode has the semiconductor element 10 having the electrodes 13, 14, 15 in both the front and rear faces 11, 12, the front face side metallic layer 21 connected to the front face 11 of this semiconductor element 10, and the rear face side metallic layer 22 connected to the rear face 12 of the semiconductor element 10. The electrodes 13 to 15 of the semiconductor element are electrically connected to the metallic layers 21, 22 connected to a face of the semiconductor element 10 on which the electrodes 13 to 15 are located. Thus, the electrodes 13 to 15 are taken out to the exterior through the metallic layers 21, 22.

Thus, it is set to a structure for nipping both the front and rear faces 11, 12 of the semiconductor element 10 by the metallic layers 21, 22 for taking-out the electrodes 13 to 15 of the semiconductor element 10 to the exterior. Therefore, this semiconductor device 100 is easily manufactured by nipping and collectively cutting the semiconductor element 10 of a wafer state by the metallic layers 21, 22 as in the above manufacturing method.

Further, the electrodes 13 to 15 arranged on both the front and rear faces 11, 12 of the semiconductor element 10 can be taken out to the exterior through the metallic layers 21, 22. Therefore, the wire bonding as in the former case is not used.

Therefore, as shown in the above FIGS. 2A to 2D, the planar size of the device also including the metallic layers 21, 22 can be substantially set within the planar size of the semiconductor element 10, i.e., the planar size of a chip. Concretely, as shown in the above FIGS. 2A to 2D, the planar sizes of both the metallic layers 21, 22 are equal to or smaller than the planar size of the semiconductor element 10.

Accordingly, in accordance with this embodiment mode, in the semiconductor device 100 in which the semiconductor element 10 having the electrodes 13 to 15 on both the front and rear faces 11, 12 is arranged, and the electrodes 13 to 15 of this semiconductor element 10 are electrically taken out to the exterior, the semiconductor device 100 can be manufactured by a simple process and can be compactly made.

Further, in the semiconductor device 100 of this embodiment mode, the electrodes 14, 15 of the rear face 12 side of the semiconductor element 10 are divided into plural electrodes, and the rear face side metallic layer 22 is also divided correspondingly to its dividing pattern. However, a portion between these dividing portions is sealed by the seal resin 30 of an electric insulating property. Therefore, a short circuit, etc. between the dividing portions can be prevented.

(Second Embodiment Mode)

Figure 7:
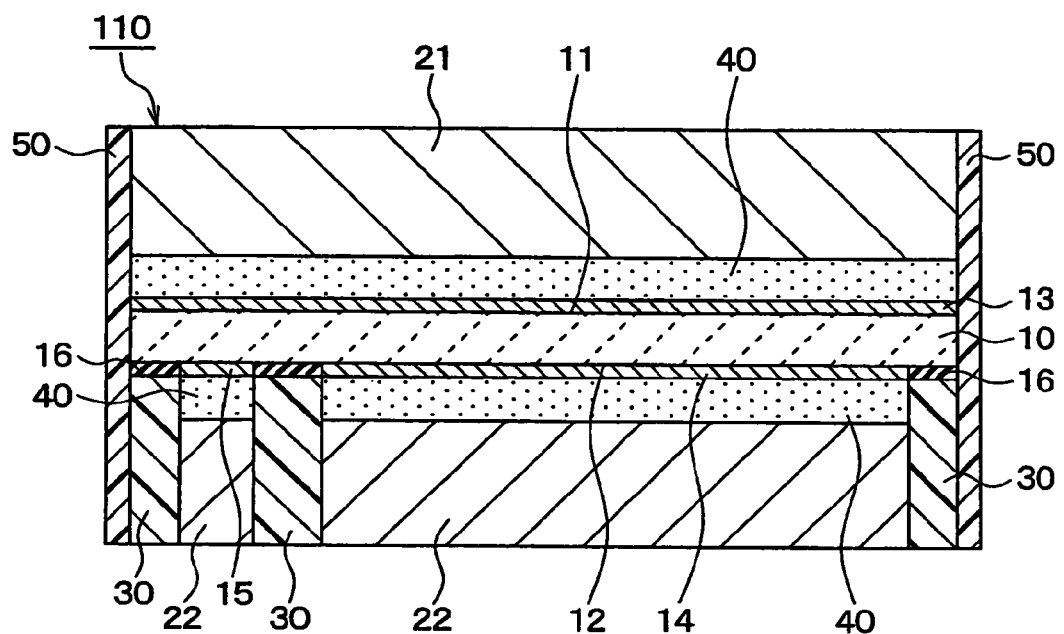
FIG. 7 is a cross sectional view showing a semiconductor device according to a second embodiment.

FIG. 7 is a schematic sectional view showing the entire construction of a semiconductor device 110 in accordance with a second embodiment mode.

In the semiconductor device 110 of this embodiment mode, an end face of the semiconductor element 10 located between end faces of both the metallic layers 21, 22 located on both the front and rear faces 11, 12 of the above semiconductor element 10 is further covered with resin 50 of an electric insulating property in the structure shown in the above FIG. 1. This resin 50 is hereinafter called coating resin 50.

This coating resin 50 is constructed by resin of an electric insulating property, and may be also a mold material such as epoxy system resin, etc. similar to the above seal resin 30, but may be also constructed by a resin material different from the mold material. This coating resin 50 can be arranged by coating an end face of the semiconductor device with the coating resin 50 after the dicing cut in the above manufacturing method.

In the example shown in FIG. 7, the coating resin 50 coats the end faces of both the metallic layers 21, 22, and an end face of the solder 40 as a boundary portion of each of the metallic layers 21, 22 and the semiconductor element 10 as well as the end face of the semiconductor element 10. Namely, here, the entire end face of the semiconductor device 110 is substantially coated with the coating resin 50.

Thus, the end face of the semiconductor element 10 is protected by coating the end face of the semiconductor element 10 with the coating resin 50. Further, a short circuit of both the metallic layers 21, 22 formed through the end face of the semiconductor element 10, i.e., creeping discharge can be restrained by this coating resin 50, and withstand voltage is increased.

(Third Embodiment Mode)

Figure 8:
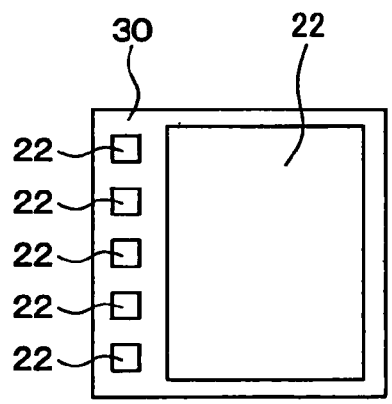
FIG. 8 is a partially enlarged plan view showing a semiconductor device according to a third embodiment.

FIG. 8 is a schematic plan view showing the construction of a main portion in a semiconductor device in accordance with a third embodiment mode, and corresponds to a planar construction of the rear face side metallic layer 22 side in the semiconductor device shown in the above FIG. 1.

As shown in FIG. 8, seal resin 30 is arranged in the entire circumference of the end face located in a circumferential portion of the semiconductor element 10 in the rear face side metallic layer 22, and the entire circumference of the end face of the rear face side metallic layer 22 is coated with the seal resin 30.

In the seal resin 30, it is sufficient to seal a portion between individual dividing portions in at least the rear face side metallic layer 22, and the seal resin 30 may be also arranged only between the dividing portions. However, in addition to this, the seal resin 30 may be also arranged in the entire circumference of the above end face of the rear face side metallic layer 22.

Thus, the rear face side metallic layer 22 is set to a shape also connected to the semiconductor element 10 by the seal resin 30 as well as the solder 40. Namely, a state for reinforcing a connecting portion of the rear face side metallic layer 21 and the semiconductor element 10 using the solder 40 is attained by this seal resin 30. Connection strength of this rear face side metallic layer 22 with respect to the semiconductor element 10 can be improved.

Figure 9:
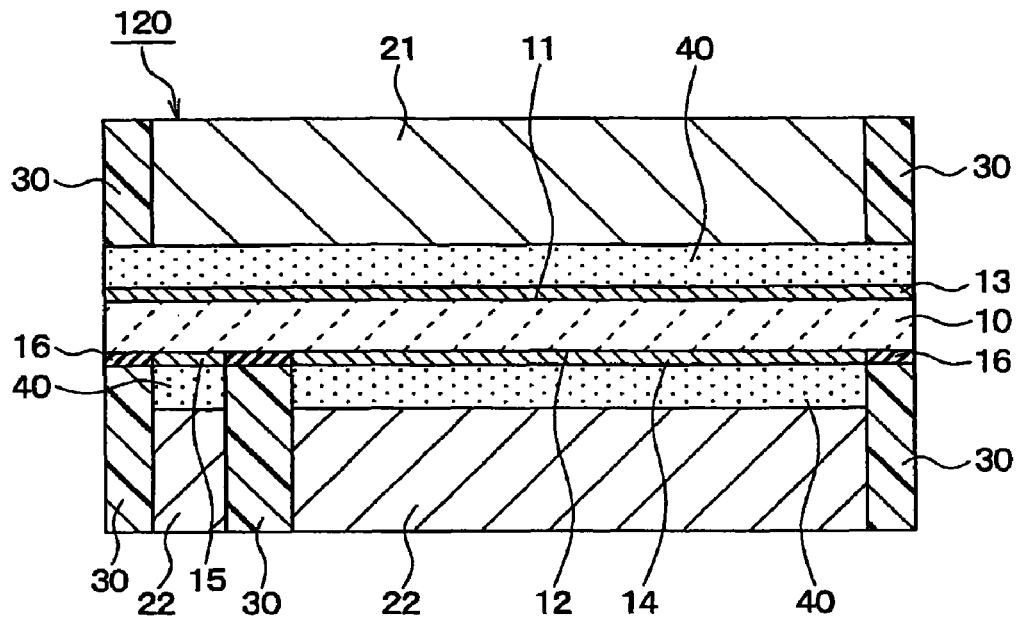
FIG. 9 is a cross sectional view showing a semiconductor device according to a modification of the third embodiment.

Further, FIG. 9 is a schematic sectional view showing the entire construction of a semiconductor device 120 as another example of this embodiment mode.

In the above FIG. 8, the entire circumference of the end face located in the circumferential portion of the semiconductor element 10 is coated with the seal resin 30 on only the rear face side metallic layer 22 side. However, as shown in FIG. 9, the entire circumference of the end face located in the circumferential portion of the semiconductor element 10 may be also coated with the seal resin 30 in both the metallic layers 21, 22 of both the front and rear faces. In accordance with this construction, connection strength of both the metallic layers 21, 22 with respect to the semiconductor element 10 can be improved.

Here, a concave portion similar to the concave portion 302a (see the above FIGS. 3A to 3D) of the plate material 302 injecting the seal resin 30 thereinto in the above manufacturing method is also arranged in the plate material 301 of the front face side so that the seal resin 30 for coating the end faces of the metallic layers 21, 22 in the above FIGS. 8 and 9 can be arranged. Otherwise, the seal resin 30 can be arranged by separately performing coating after the dicing cut.

Further, the seal resin 30 of such an end face may be also arranged in only the front face side metallic layer 21 so that the connection strength of the front face side metallic layer 21 with respect to the semiconductor element 10 may be also improved.

Namely, in this embodiment mode, resin is arranged in the entire circumference of the end face located in the circumferential portion of the semiconductor element 10 in at least one metallic layer of both the metallic layers 21, 22 located on both the front and rear faces 11, 12 of the semiconductor element 10. It is sufficient to reinforce the connecting portion by this resin as mentioned above.

The resin for reinforcing this connecting portion may not be also the same resin as the seal resin 30, and may be also resin of a different material.

(Fourth Embodiment Mode)

Figure 10:
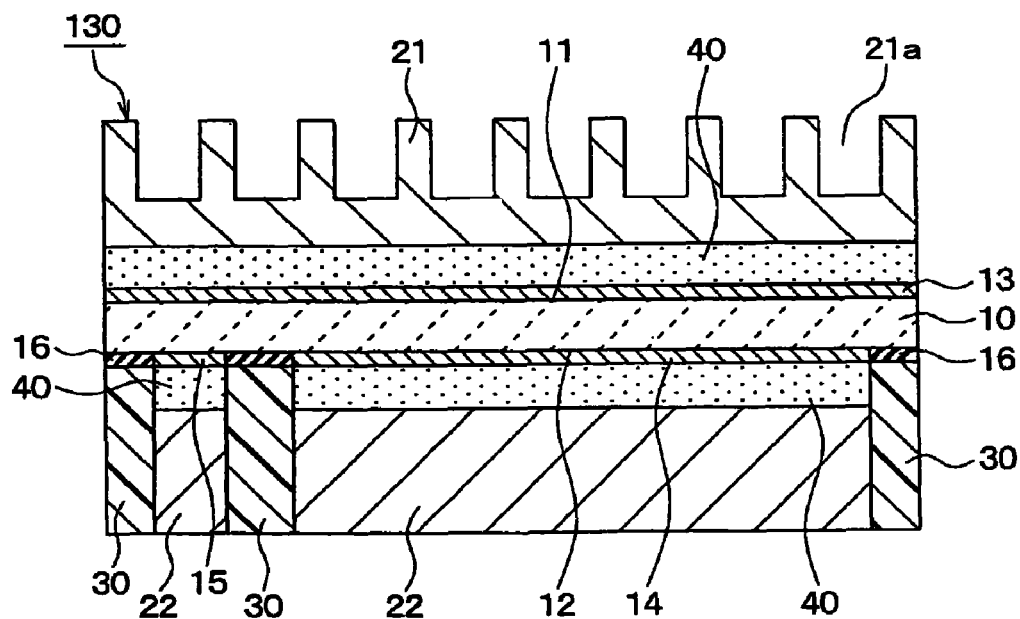
FIG. 10 is a cross sectional view showing a semiconductor device according to a fourth embodiment.

FIG. 10 is a schematic sectional view showing the entire construction of a semiconductor device 130 in accordance with a fourth embodiment mode.

In the semiconductor device 130 of this embodiment mode, a fin portion 21a forming a fin shape on an outer face of the front face side metallic layer 21 is constructed. A heat radiating area is increased by this fin portion 21a, and it is possible to improve a heat radiating property through the front face side metallic layer 21.

In FIG. 10, the fin portion 21a has the fin shape of a flat plate shape. However, if the fin portion 21a has a shape able to improve the heat radiating property, a fin shape except for this shape may be also used. Such a fin portion 21a can be formed by etching, press, etc.

Further, it is sufficient to set the outer face of at least one metallic layer of both the metallic layers 21, 22 to the fin shape so as to improve the heat radiating property of the semiconductor device. For example, the outer face of the rear face side metallic layer 22 may be also set to the fin shape. Further, the outer faces of both the metallic layers 21, 22 may be also set to the fin shape. This embodiment mode can be applied to each of the above embodiment modes.

(Fifth Embodiment Mode)

Figure 11:
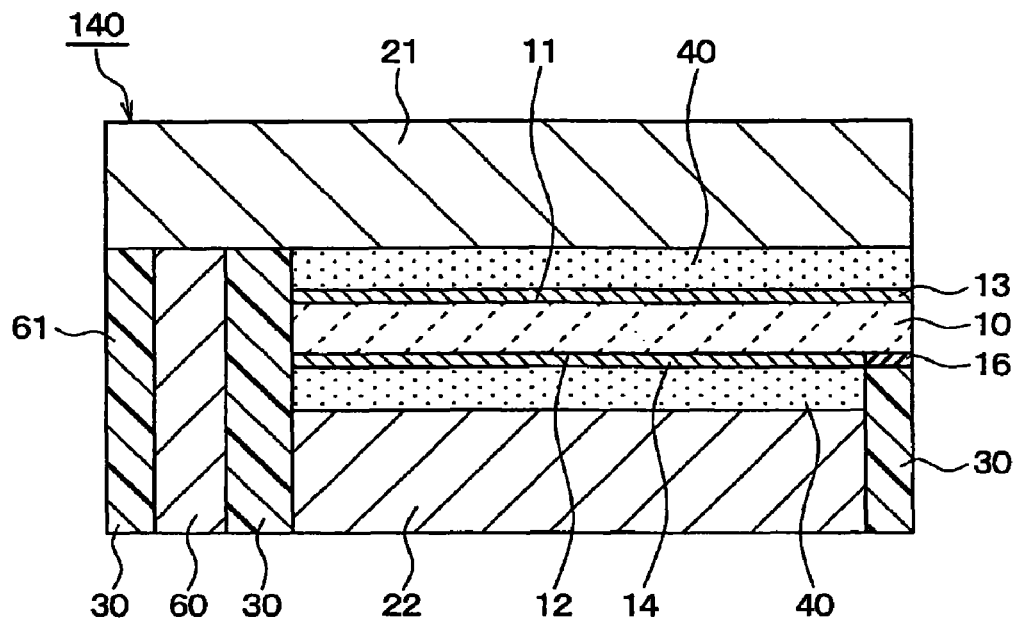
FIG. 11 is a cross sectional view showing a semiconductor device according to a fifth embodiment.

FIG. 11 is a schematic sectional view showing the entire construction of a semiconductor device 140 in accordance with a fifth embodiment mode.

As shown in FIG. 11, the semiconductor device 140 of this embodiment mode has an electrical conductive member 60 extending from the front face side metallic layer 21 side among both the metallic layers 21, 22 located on both the front and rear faces 11, 12 of the semiconductor element 10 to the rear face side metallic layer 22 side. The front face side metallic layer 21 is electrically taken out to the rear face side metallic layer 22 side through this electrical conductive member 60.

Concretely, the electrical conductive member 60 is formed in a columnar shape constructed by an electrical conductive material such as Cu, iron, etc., and exceeds the semiconductor element 10 and is extended from the front face 11 side of the semiconductor element 10 to the rear face 12 side through a passing portion 61 arranged in the semiconductor element 10. In FIG. 11, the gate electrode 15 is omitted.

Here, for example, the passing portion 61 can be constructed by a through hole passing through the semiconductor element 10 in its thickness direction, a notch portion of the circumferential portion of the semiconductor element 10, etc. Further, one end side of the electrical conductive member 60 is electrically connected to the front face side metallic layer 21 by soldering, brazing, or welding, etc. An intermediate portion of the electrical conductive member 60 is sealed by the seal resin 30, and the other end portion of the electrical conductive member 60 can be connected to the exterior.

In accordance with this embodiment mode, the electrodes 13 to 15 of both the front and rear faces 11, 12 in the semiconductor element 10 can be taken out on the rear face 12 side of the semiconductor element 10, and a structure for intensively taking-out the electrodes on one face can be realized.

Conversely to FIG. 11, an electrical conductive member 60 may be also connected to the rear face side metallic layer 22, and the rear face side metallic layer 22 may be also taken out on the front face side metallic layer 21 side through this electrical conductive member 60. Such a construction of this embodiment mode can be applied to each of the above embodiment modes.

(Sixth Embodiment Mode)

Figure 12:
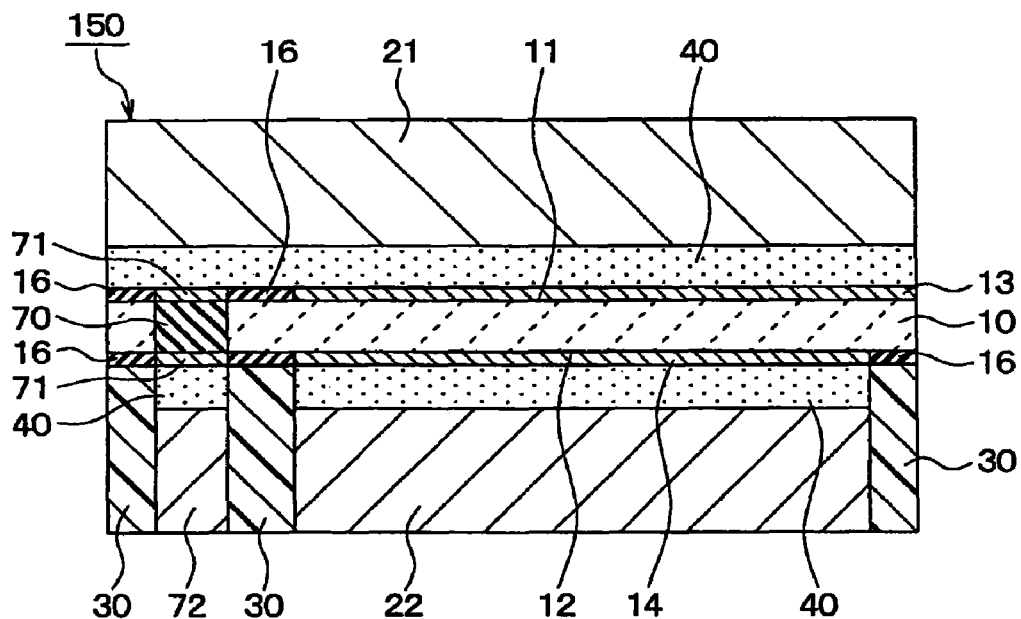
FIG. 12 is a cross sectional view showing a semiconductor device according to a sixth embodiment.

FIG. 12 is a schematic sectional view showing the entire construction of a semiconductor device 150 in accordance with a sixth embodiment mode. In FIG. 12, the gate electrode 15 is omitted.

In the semiconductor device 150 of this embodiment mode, as shown in FIG. 12, one portion of the semiconductor element 10 is constructed as a conductor portion 70 electrically conducted in the thickness direction of the semiconductor element 10. Thus, the front face side metallic layer 21 is taken out on the rear face side metallic layer 22 side through this conductor portion 70.

Concretely, in the conductor portion 70, a high concentration ion implanting area is formed in a circumferential portion of the semiconductor element 10 in its entire thickness direction. For example, such a conductor portion 70 can be formed by using the technique of a semiconductor process in which impurities of B (boron), P (phosphorus), etc. are implanted and diffused in accordance with an electric conductivity type of a wafer constituting the semiconductor element 10.

In this conductor portion 70, a taking-out electrode 71 constructed by aluminum, etc. is formed on both the front and rear faces 11, 12 of the semiconductor element 10, and this taking-out electrode 71 and the conductor portion 70 are electrically connected.

The front face side metallic layer 21 is connected to the taking-out electrode 71 of the front face 11 side through the solder 40. A lead electrode 72 is connected to the taking-out electrode 71 of the rear face 12 side through the solder 40.

For example, in the above manufacturing method, this lead electrode 72 can be formed as one portion of the plate material 302 for forming the rear face side metallic layer 22. Further, an intermediate portion of the lead electrode 72 is sealed by the seal resin 30.

Thus, the electrode 13 of the front face 11 in the semiconductor element 10 can be taken out on the rear face 12 side of the semiconductor element 10 from the front face side metallic layer 21 through the solder 40, the taking-out electrode 71, the conductor portion 70, the taking-out electrode 71, the solder 40 and the lead electrode 72. Thus, a structure for intensively taking-out the electrode on one face can be also realized in this embodiment mode.

Conversely to FIG. 12, a conductor portion 70 may be connected to the rear face side metallic layer 22, and the rear face side metallic layer 22 may be also taken out to the front face side metallic layer 21 side through this conductor portion 70. Such a construction of this embodiment mode can be applied to each of the above embodiment modes.

(Seventh Embodiment Mode)

Figure 13:
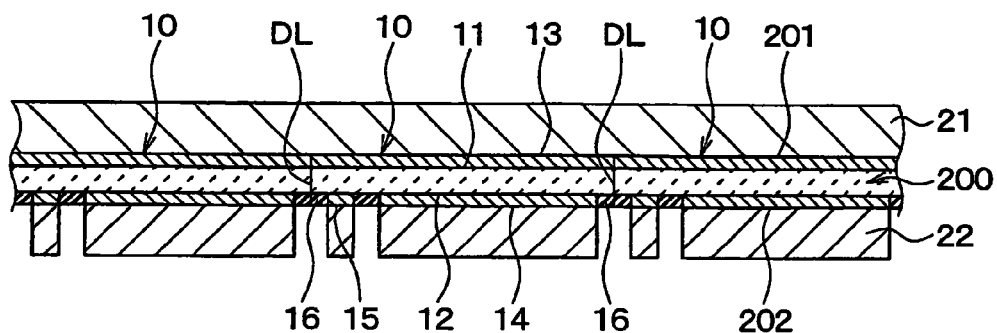
FIG. 13 is a partially enlarged cross sectional view showing a semiconductor device according to a seventh embodiment.

FIG. 13 is a schematic sectional view showing a main portion of a manufacturing method of a semiconductor device in accordance with a seventh embodiment mode.

It is sufficient if both the metallic layers 21, 22 are respectively connected to the front face 11 and the rear face 12 of the semiconductor element 10, and are electrically connected to the electrodes 13 to 15 on the respective faces. Further, it is sufficient if these electrodes 13 to 15 can be connected to the exterior through the respective metallic layers 21, 22.

In each of the above embodiment modes, the respective metallic layers 21, 22 and the electrodes 13 to 15 are electrically connected through the electrical conductive joining member 40, but the present embodiments are not limited to this case. In this embodiment mode, the metallic layers 21, 22 electrically connected to the electrodes 13 to 15 are set to be constructed by a plating film formed on the electrodes 13 to 15.

The metallic layers 21, 22 as such a plating film can be formed by using a publicly known plating method using Cu, etc. with respect to the above semiconductor wafer 200 (see FIG. 3A). In accordance with such a plating method, a plating film is selectively deposited on the surfaces of the electrodes 13 to 15, and the metallic layers 21, 22 can be formed. FIG. 13 shows a state up to now.

One example of a concrete plating method will be described. After Cu plating is formed on the entire face of the above semiconductor wafer, partial etching is performed and the electrodes 13 to 15 are separated. In this case, for example, Cu is deposited about 0.01 μm on the entire face of the semiconductor wafer by vacuum evaporation, and Cu plating is thickly performed by electric plating. Thereafter, a photo mask is formed on the Cu plating and the electrodes 13 to 15 are separated by etching.

Further, the metallic layers 21, 22 may be also formed by depositing the Cu plating on the surfaces of the electrodes 13 to 15 in a separating state of the electrodes 13 to 15 by electroless Cu plating for selectively depositing only portions of the electrodes 13 to 15.

Thus, after the metallic layers 21, 22 are formed, similar to the above manufacturing method, the seal resin 30 is injected to a portion between dividing portions in the divided rear face side metallic layer 22, and outer faces of the metallic layers 21, 22 are polished, etc., and dicing cut is finally performed. Thus, in this embodiment mode, a semiconductor device having the metallic layers 21, 22 constructed by a plating film is provided.

In this semiconductor device, with respect to the thicknesses of the metallic layers 21, 22 constructed by a plating film, a thickness for restraining deformation and a warp of the semiconductor element 10 due to thermal expansion, etc. of the metallic layers 21, 22 as described in the above first embodiment mode can be also applied. Further, this embodiment mode can be applied to the above second to sixth embodiment modes.

(Eighth Embodiment Mode)

Figure 14:
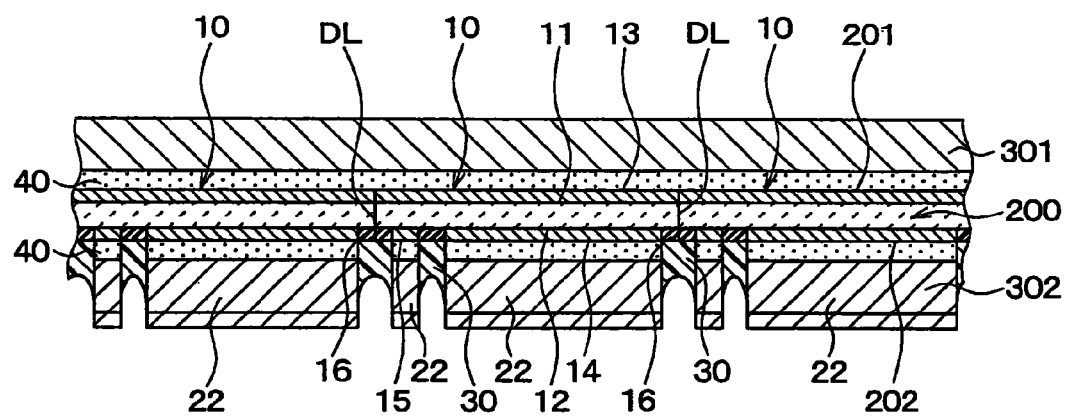
FIG. 14 is a partially enlarged cross sectional view showing a semiconductor device according to an eighth embodiment.

FIG. 14 is a schematic sectional view showing a main portion of a manufacturing method of a semiconductor device in accordance with an eighth embodiment mode.

In the manufacturing method shown in the above first embodiment mode, on the face of the side opposed to the connecting face with the semiconductor wafer 200 in the plate material 302 as the rear face side metallic layer 22, the entire face of this opposed side is polished and removed by the plate thickness of the bottom portion of the concave portion 22a (see the above FIG. 4B).

Here, no removal is performed over the entire face of this opposed side, but it is sufficient to form the rear face side metallic layer 22 as a divided metallic layer. Further, the partial removing method of substantially removing only the bottom portion of the concave portion 22a may be also adopted.

In the manufacturing method of this embodiment mode, similar to the manufacturing method shown in the above FIGS. 3A to 3D and 4A to 4C, processing is performed until the plate materials 301, 302 are soldered and the seal resin 30 is injected (see the above FIG. 4A).

Thereafter, as shown in FIG. 14, only the bottom portion 22a of the concave portion 22a on the face of the above opposed side in the plate material 302, i.e., only a portion corresponding to the seal resin 30 is substantially notched by using a dicing device, etc.

Thus, the plate material 302 is divided and formed as the rear face side metallic layer 22. In this case, as shown in FIG. 14, one portion of the seal resin 30 is also easily notched, but there is particularly no problem.

Thereafter, in the manufacturing method of this embodiment mode, a semiconductor device similar to that shown in the above FIG. 1 is completed by polishing the outer faces of the metallic layers 21, 22, etc., and finally performing the dicing cut.

In this embodiment mode, for example, the above partial removing method may be also performed by sandblast, etching, etc. in addition to the dicing device. The manufacturing method of this embodiment mode can be applied to manufacture of the semiconductor devices of the above second to sixth embodiment modes.

(Ninth Embodiment Mode)

Figure 15A:
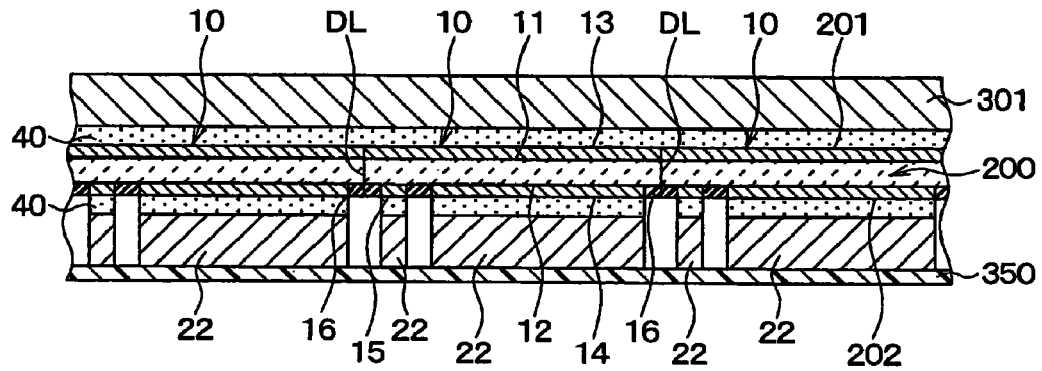
FIGS. 15A and 15B are partially enlarged cross sectional views showing semiconductor devices according to a ninth embodiment.
Figure 15B:
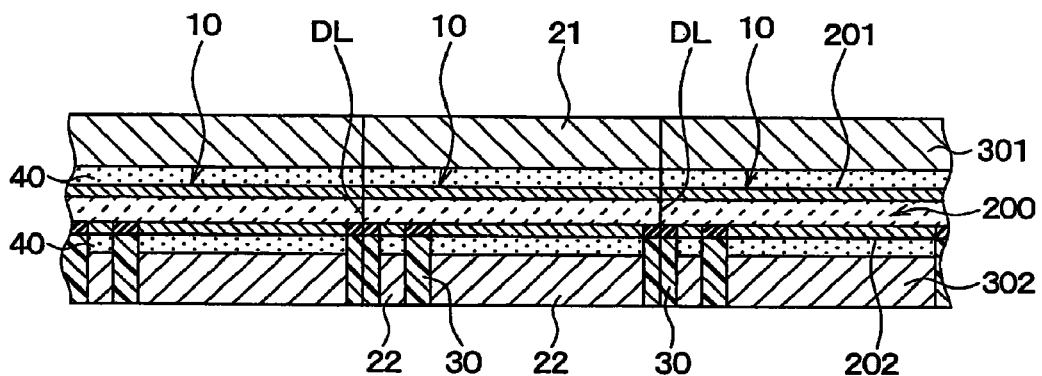

FIGS. 15A and 15B are schematic sectional views showing a main portion of a manufacturing method of a semiconductor device in accordance with a ninth embodiment mode.

In the manufacturing method shown in the above FIGS. 3A to 3D and 4A to 4C, as a process for connecting the divided rear face side metallic layer 22 to the semiconductor element 10, the plate material 302 forming the concave portion 22a is used and soldered to the semiconductor element 10, and the plate material 302 is then divided.

In contrast to this, as shown in FIG. 15A, the manufacturing method of this embodiment mode uses an integrating member of a state in which an individual dividing portion in the divided rear face side metallic layer 22 is integrally fixed by a film member 350.

Here, a pressure sensitive adhesive, etc. constructed by polyimide, etc. can be used as the film member 350. For example, such an integrating member is formed by sticking and fixing a divided copper plate to the film member 350, and sticking the film member 350 to one face of the copper plate in advance and dividing this copper plate from the other face side of a side opposed to the film member 350, etc. by etching, etc.

As shown in FIG. 15A, the rear face side metallic layer 22 constituting this integrating member is connected to the rear face 202 of the semiconductor wafer 200 through the solder 40. Further, the plate material 301 is simultaneously connected to the front face 201 of the semiconductor wafer 200 through the solder 40.

Thereafter, as shown in FIG. 15B, the film member 350 is stripped from the rear face side metallic layer 22. Thus, it attains a state in which the front face side metallic layer 21 is connected on the front face 201 of the semiconductor wafer 200, and the rear face side metallic layer 22 as a divided metallic layer is connected on the rear face 202 side.

Next, the above seal resin 30 is injected between dividing portions in the rear face side metallic layer 22 although this seal resin 30 is unillustrated. This seal resin 30 is injected by a method such as a transfer mold method, burying using a squeegee, etc.

Thereafter, surface polishing, etc. of the plate material 302 of the rear face side are performed in accordance with necessity. In this embodiment mode, a semiconductor device similar to that shown in the above FIG. 1 is also completed by finally performing the dicing cut.

Here, in the manufacturing method of this embodiment mode, the seal resin 30 is injected in advance between the dividing portions of the rear face side metallic layer 22 in the above integrating member, and may be also soldered to the semiconductor wafer 200.

Further, in the above integrating member, a hole may be arranged in a part located between the dividing portions of the rear face side metallic layer 22 in the film member 350, and the seal resin 30 may be also injected from the hole of the film member 350 after the integrating member is soldered to the semiconductor wafer 200. In this case, the film member 350 is stripped after the seal resin 30 is filled.

Such a manufacturing method of this embodiment mode can be also applied to manufacture of the semiconductor devices of the above second to sixth embodiment modes.

(Tenth Embodiment Mode)

Figure 16:
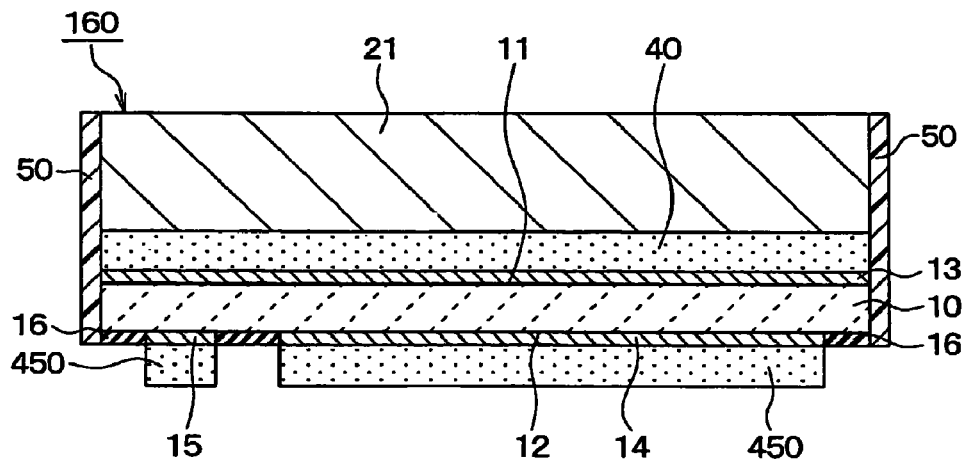
FIG. 16 is a cross sectional view showing a semiconductor device according to a tenth embodiment.

FIG. 16 is a schematic sectional view showing the entire construction of a semiconductor device 160 in accordance with a tenth embodiment mode. Here, an upper face 11 of the semiconductor element 10 in the semiconductor device 160 within FIG. 16 is also set to the front face 11, and a lower face 12 is set to the rear face 12.

In the semiconductor device of each of the above embodiment modes, the metallic layers 21, 22 are connected to both the front and rear faces 11, 12 of the semiconductor element 10. However, in the semiconductor device 160 of this embodiment mode, a metallic layer 21 is arranged in only one of both the front and rear faces 11, 12 of the semiconductor element 10.

Here, this metallic layer 21 is the same as the above front face side metallic layer 21, and is connected to the collector electrode 13 through an electrical conductive joining member 40 on the front face 11 of the semiconductor element 10. In this case, the planar size of the front face side metallic layer 21 is also the planar size of the semiconductor element 10 or less, and lies in the range of the planar size of the semiconductor element 10.

When the metallic layer is arranged in only one of both the front and rear faces 11, 12 of the semiconductor element 10, the metallic layer may be also arranged on only the rear face 12 of the semiconductor element 10. In this case, similar to the construction of the rear face 12 side of the semiconductor element 10 in the above FIG. 1, etc., it is sufficient to connect the above rear face side metallic layer to the emitter electrode 14 and the gate electrode 15 through the electrical conductive joining member 40.

Further, in this embodiment mode, the front face side metallic layer 21 may be also formed by plating on the collector electrode 13 similarly to the front face side metallic layer of the above FIG. 13, and may be also formed in a fin shape as shown in the above FIG. 10.

Further, as shown in FIG. 16, in this embodiment mode, the end face of the front face side metallic layer 21 and the end face of the semiconductor element 10 are also coated with coating resin 50 of an electric insulating property, and are protected. This coating resin 50 is similar to that shown in the above FIG. 7, but may not be arranged in this embodiment mode.

Further, as shown in FIG. 16, in this embodiment mode, a solder bump 450 is arranged in the emitter electrode 14 and the gate electrode 15 on the rear face 12 side of the semiconductor element 10. This is because, when this semiconductor device 160 is mounted to a print substrate, etc., electric connection with this print substrate is made through this solder bump 450.

This solder bump 450 may be also arranged on the semiconductor device 160 side in advance, and may be also arranged on the print substrate side. For example, the solder bump 450 can be formed by a printing method, plating, etc.

For example, the semiconductor device 160 of this embodiment mode can be manufactured by using the manufacturing method when no rear face side metallic layer is arranged in the manufacturing method shown in the above FIGS. 3A to 3D and 4A to 4C. Namely, the semiconductor device 160 of this embodiment mode is completed by connecting the plate material 301 constituting the metallic layer 21 to only the front face 201 of the above semiconductor wafer 200 through the solder 40, and next performing the dicing cut.

Figure 17A:
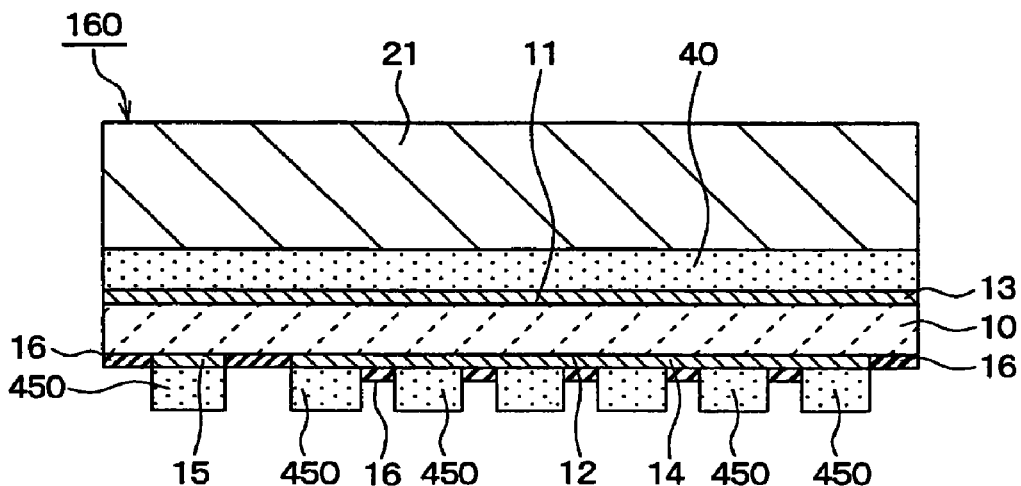
FIG. 17A is a cross sectional view showing the device having a divisional bump.
Figure 17B:
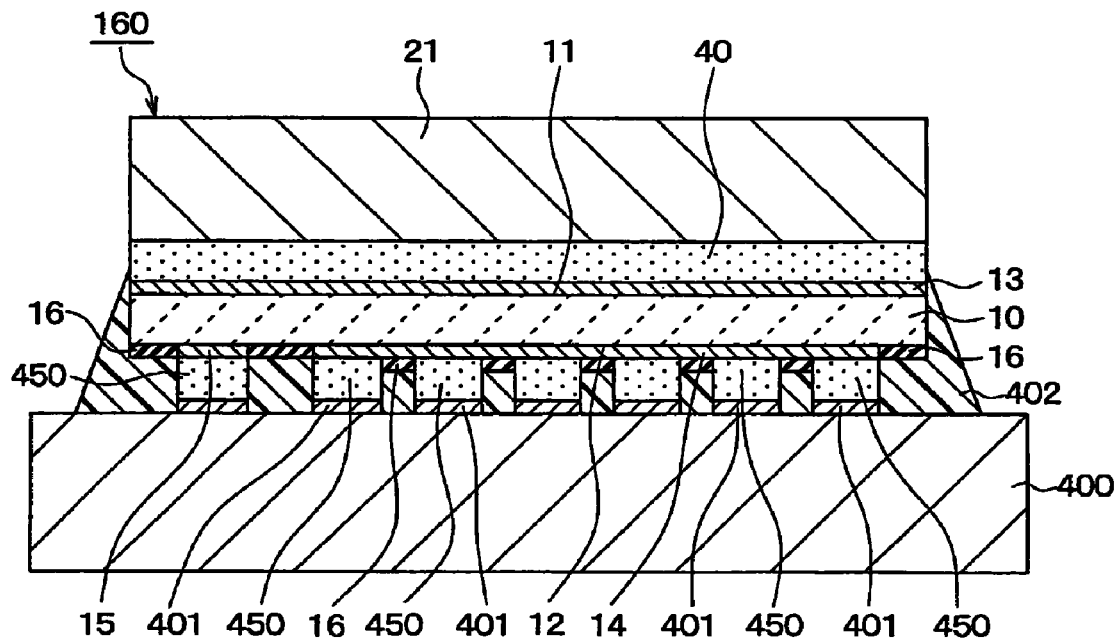
FIG. 17B is a cross sectional view showing the device mounted on a substrate.

The semiconductor device 160 of this embodiment mode manufactured in this way is mounted to a substrate through a solder bump 450 of the rear face 12 side of the above semiconductor element 10. Here, FIG. 17A is a schematic sectional view showing an example in which the solder bump 450 is divisionally arranged in the semiconductor device 160 of this embodiment mode. FIG. 17B is a schematic sectional view showing a structure in which the semiconductor device 160 shown in FIG. 17A is mounted to the substrate 400.

As shown in FIGS. 17A and 17B, the solder bump 450 is arranged as plural divided bumps in the emitter electrode 14 of the rear face 12 side of the semiconductor element 10. Here, a portion between the respective solder bumps 450 is insulated by the above protecting film 16. Each solder bump 450 is joined to a land 401 of the substrate 400. In this mounting structure, underfill resin 402 is filled between the respective solder bumps 450 between the semiconductor device 160 and the substrate 400, and connection reliability is raised.

Here, the solder bump 450 is divided for the following reasons. In the case of an electrode of a wide area, many voids are generated when the electrode is soldered to a substrate. Therefore, a solder crack is easily caused by environmental stress of a market, and connection life is greatly dispersed. Further, an electrode area of the emitter electrode 14 is large in comparison with the gate electrode 15. Therefore, the semiconductor device is greatly inclined at a mounting time, and the solder bump 450 for the gate electrode 15 is easily opened to the land 401 of the substrate 400.

Further, when the land 401 is divided, an injection property in filling the underfill resin 402 is improved. Further, an area of the underfill resin 402 coming in contact with the substrate 400 and the semiconductor device 160 is increased. Therefore, an improving effect of connection reliability using the underfill resin 402 becomes large.

At this time, when all the sizes of the individual solder bumps 450 are set to the same, the injection property of the underfill resin 402 is uniformed, and no void of the underfill resin 402 is easily generated. It is desirable to divide the solder bump 450 from these contents.

In accordance with this embodiment mode, the semiconductor device 160 can be easily manufactured by connecting the metallic layer 21 to the front face 12 having the collector electrode 13 in the semiconductor element 10. Further, the planar size also including the metallic layer 21 can be substantially included in the planar size of the semiconductor element 10. Therefore, the semiconductor device can be manufactured in a simple process and can be compactly made.

(Eleventh Embodiment Mode)

Figure 18A:
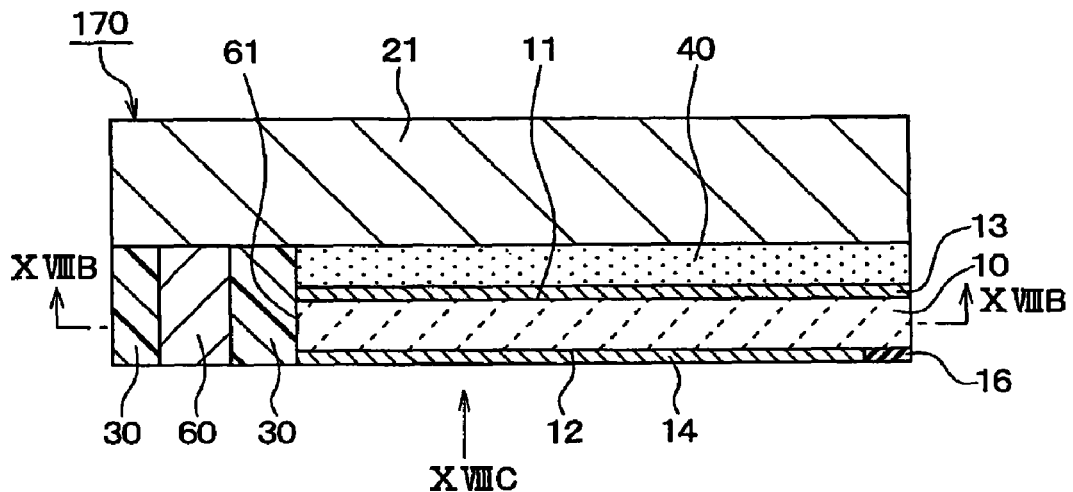
FIG. 18A is a cross sectional view showing a semiconductor device according to an eleventh embodiment.
Figure 18B:
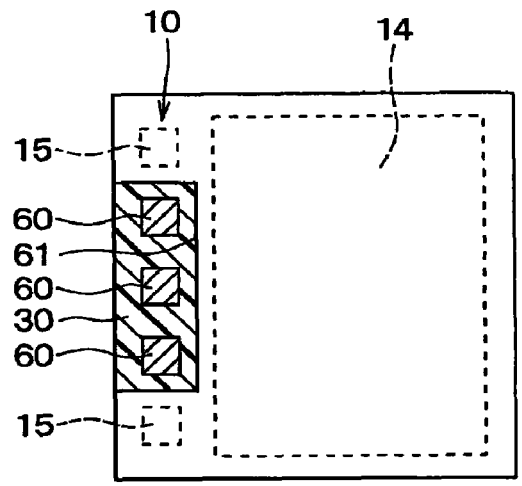
FIG. 18B is a cross sectional view showing the device taken along line XVIIIB-XVIIIB in FIG. 18A.
Figure 18C:
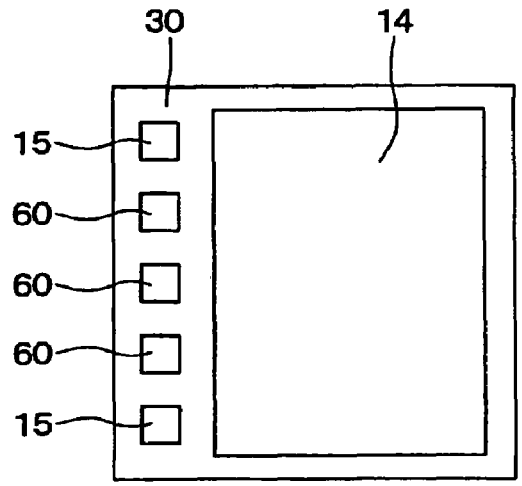
FIG. 18C is a perspective view showing the device seeing from a direction XVIIIC in FIG. 18A.

FIG. 18A is a schematic sectional view showing the entire construction of a semiconductor device 170 in accordance with an eleventh embodiment mode. FIG. 18B is a schematic sectional view of line XVIIIB-XVIIIB within FIG. 18A. FIG. 18C is a schematic plan view seen from the direction of an arrow XVIIIC within FIG. 18A.

The semiconductor device 170 of this embodiment mode also has a construction in which the front face side metallic layer 21 is connected to only the front face 11 of the semiconductor element 10. Here, in this embodiment mode, an electrical conductive member 60 extending from the front face 11 side of the semiconductor element 10 to the rear face 12 side is further arranged. The front face side metallic layer 21 is electrically taken out to the rear face 12 side through this electrical conductive member 60.

This electrical conductive member 60 is similar to that shown in the above FIG. 11, and one end side thereof is electrically connected to the front face side metallic layer 21, and exceeds the semiconductor element 10 and is extended from the front face 11 side of the semiconductor element 10 to the rear face 12 side through a passing portion 61 arranged in the semiconductor element 10. Further, an intermediate portion of the electrical conductive member 60 is sealed by the seal resin 30.

Here, as shown in FIG. 18B, the passing portion 61 of the semiconductor element 10 is a hole extending in the thickness direction of the semiconductor element 10, i.e., passing through a portion between both the front and rear faces 11, 12. For example, this passing portion 61 may be arranged in advance by etching, etc. in e.g., a wafer state. This passing portion 61 can be also formed similarly to FIG. 18B with respect to the construction shown in the above FIG. 11.

In accordance with this embodiment mode, the electrode 13 of the front face 11 in the semiconductor element 10 can be also taken out on the rear face 12 side of the semiconductor element 10, and a structure for intensively taking-out the electrode on one face can be realized.

Figure 19A:
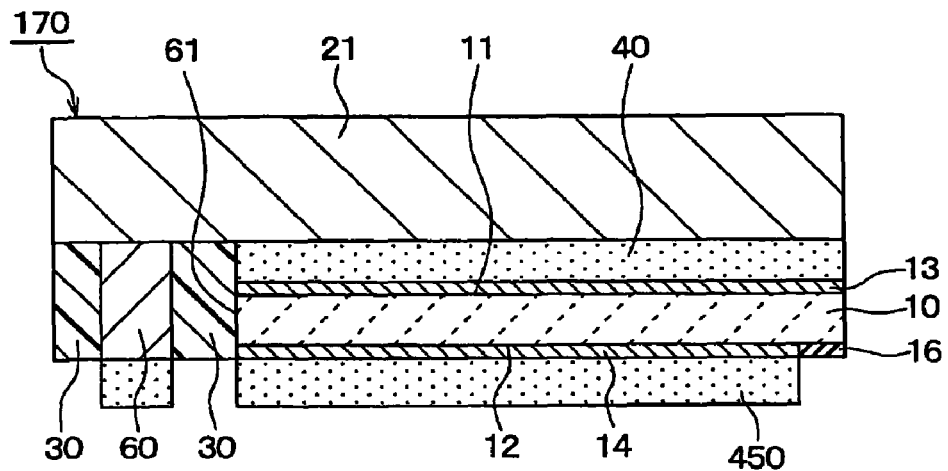
FIGS. 19A and 19B are cross sectional views showing the device having a solder bump.
Figure 19B:
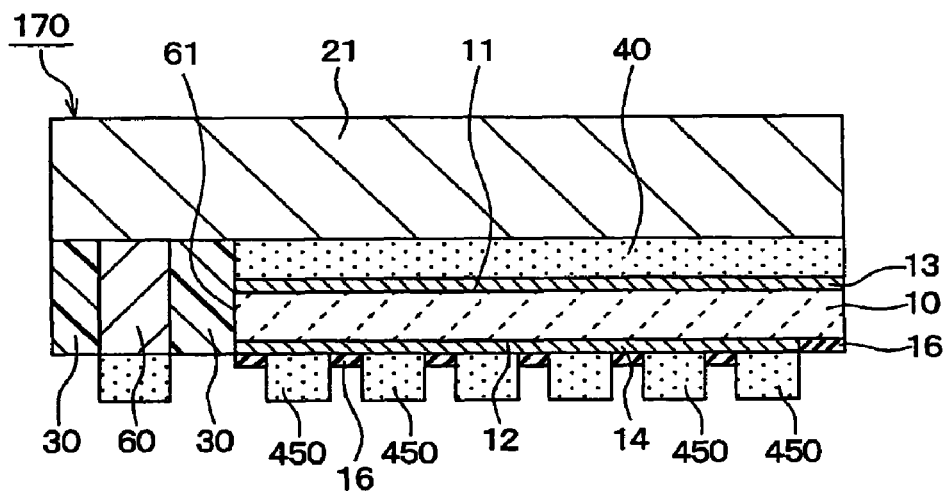

Further, FIGS. 19A and 19B are schematic sectional views showing a state in which the solder bump 450 is arranged in the electrodes 14, 15 of the rear face 12 of the semiconductor element 10 and the electrical conductive member 60 in a semiconductor device 170 of this embodiment mode. FIG. 19A shows an example in which no solder bump 450 of the emitter electrode 14 is divided. FIG. 19B shows an example in which the solder bump 450 is divided. Thus, this semiconductor device 170 can be also mounted to a substrate, etc. through the solder bump 450.

(Twelfth Embodiment Mode)

Figure 20:
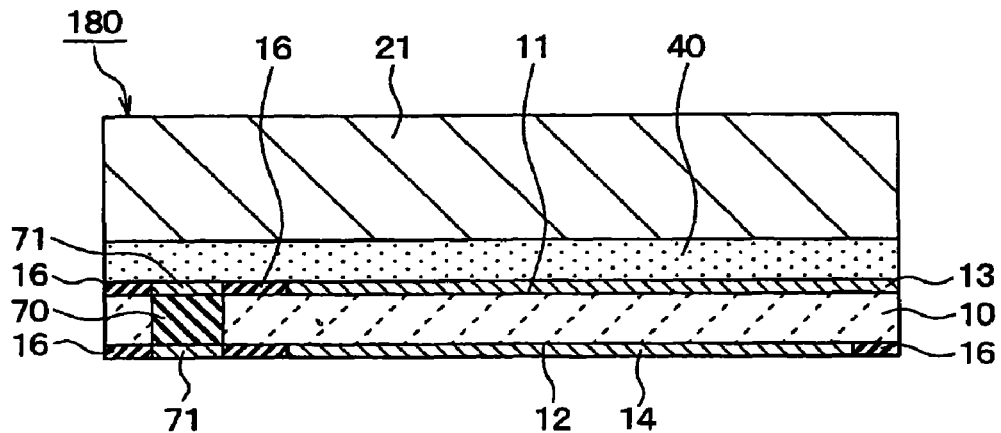
FIG. 20 is a cross sectional view showing a semiconductor device according to a twelfth embodiment.
Figure 21A:
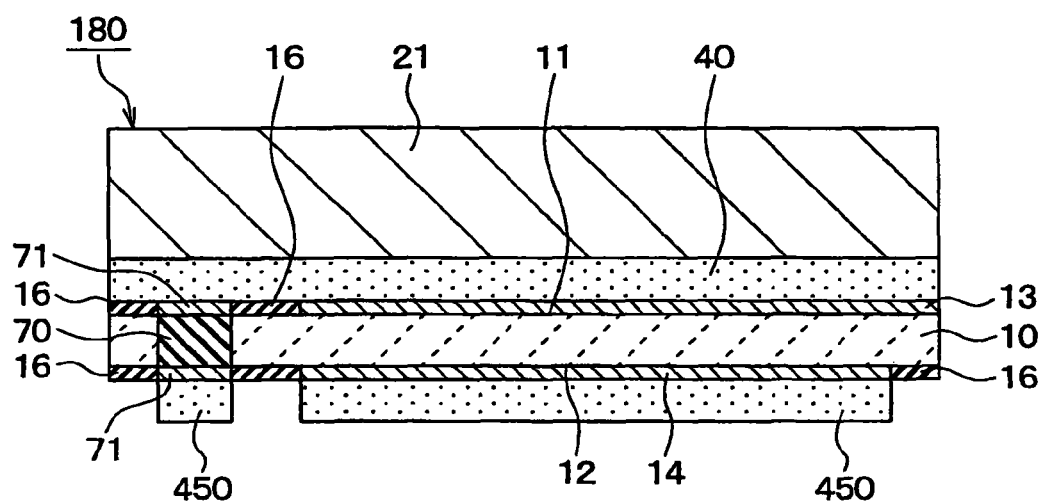
FIGS. 21A and 21B are cross sectional views showing the device having a solder bump.
Figure 21B:
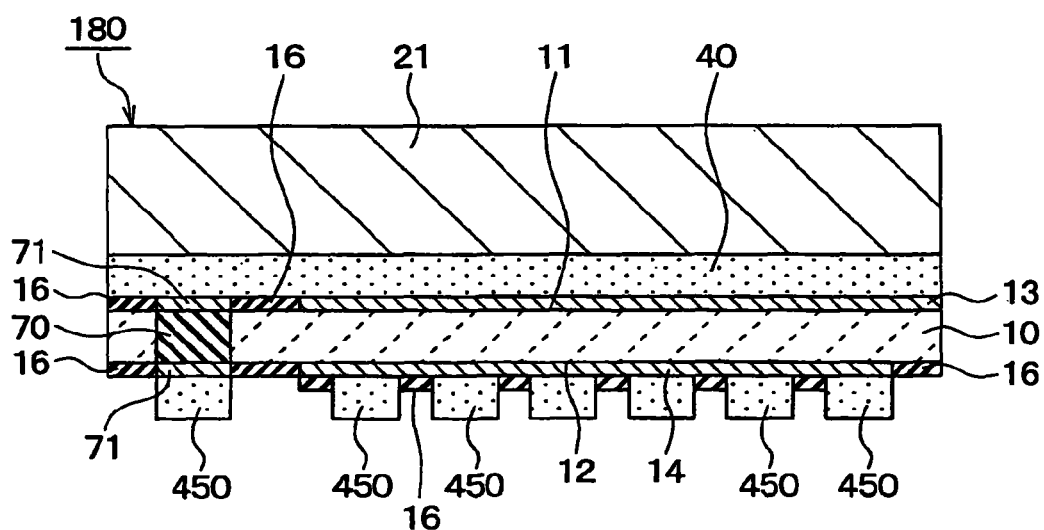

FIG. 20 is a schematic sectional view showing the entire construction of a semiconductor device 180 in accordance with a twelfth embodiment mode. Further, FIGS. 21A and 21B are schematic sectional views showing a state in which the solder bump 450 is arranged in the electrodes 14, 15 of the rear face 12 of the semiconductor element 10 in this semiconductor device 180. FIG. 21A shows an example in which no solder bump 450 of the emitter electrode 14 is divided. FIG. 21B shows an example in which the solder bump 450 is divided.

The semiconductor device 180 of this embodiment mode also has a construction in which the front face side metallic layer 21 is connected to only the front face 11 of the semiconductor element 10. Here, in this embodiment mode, one portion of the semiconductor element 10 is constructed as a conductor portion 70 electrically conducted in the thickness direction of the semiconductor element 10. The front face side metallic layer 21 is electrically taken out to the rear face 12 side of the semiconductor element 10 through this conductor portion 70.

This conductor portion 70 is similar to that shown in the above FIG. 12, and a high concentration ion implanting area is formed in a circumferential portion of the semiconductor element 10. Here, the above taking-out electrode 71 is also formed on both the front and rear faces 11, 12 of the semiconductor element 10 in the conductor portion 70.

Thus, as shown in FIGS. 21A and 21B, the front face side metallic layer 21 is electrically connected to the solder bump 450 through the taking-out electrode 71 of the front face 11, the conductor portion 70, and the taking-out electrode 71 of the rear face 12. The semiconductor device 180 of this embodiment mode is also mounted to a substrate, etc. through this solder bump 450.

In accordance with this embodiment mode, the electrode 13 of the front face 11 in the semiconductor element 10 can be also taken out on the rear face 12 side of the semiconductor element 10, and a structure for intensively taking-out the electrode on one face can be realized.

(Other Embodiment Modes)

Figure 22:
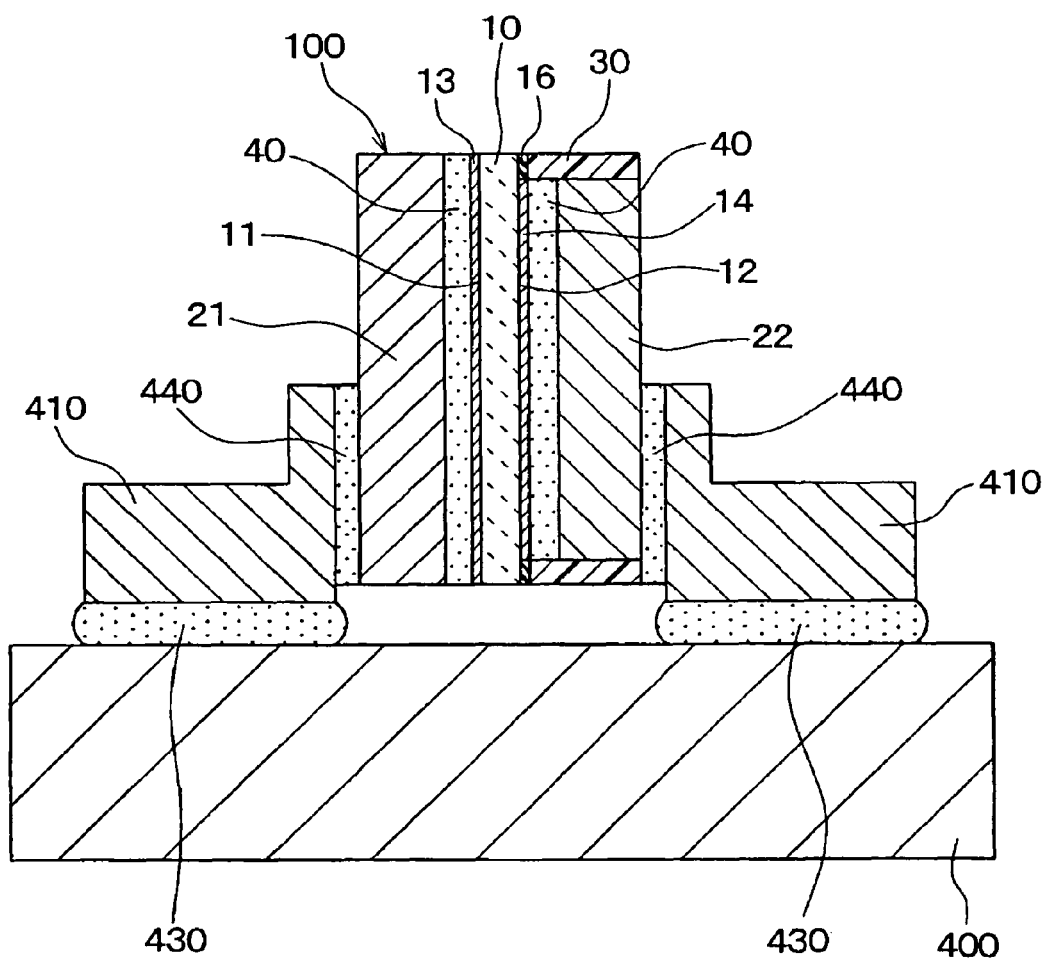
FIG. 22 is a cross sectional view showing a semiconductor device mounted on a substrate in a vertical manner.

Next, various examples are shown as other embodiment modes. A mounting structure to the substrate 400 of the semiconductor device 100 is not limited to those shown in the above FIGS. 5A, 5B and 6A, 6B, etc. As shown in FIG. 22, the semiconductor device 100 may be also mounted to the substrate 400 so as to attain a state in which the semiconductor element 10 rises on the substrate 400.

Figure 23A:
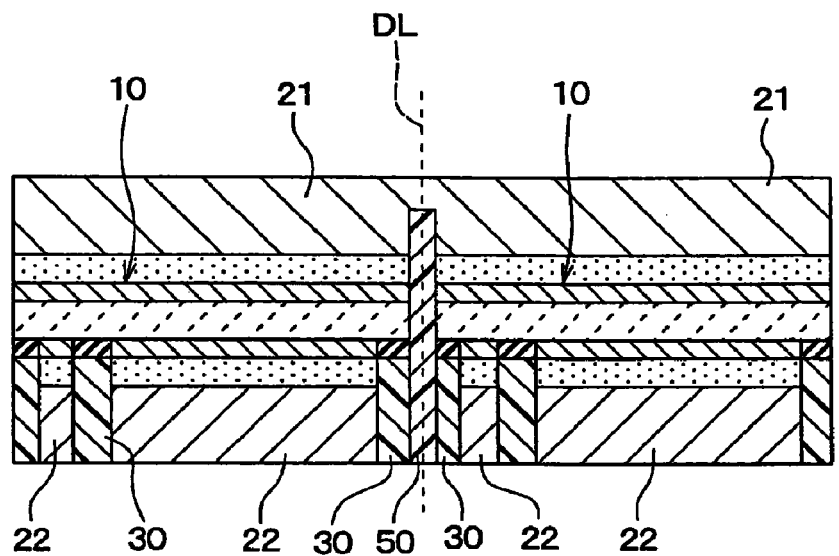
FIGS. 23A and 23B are cross sectional views showing a method for manufacturing an semiconductor device according to a modification of the first embodiment.
Figure 23B:
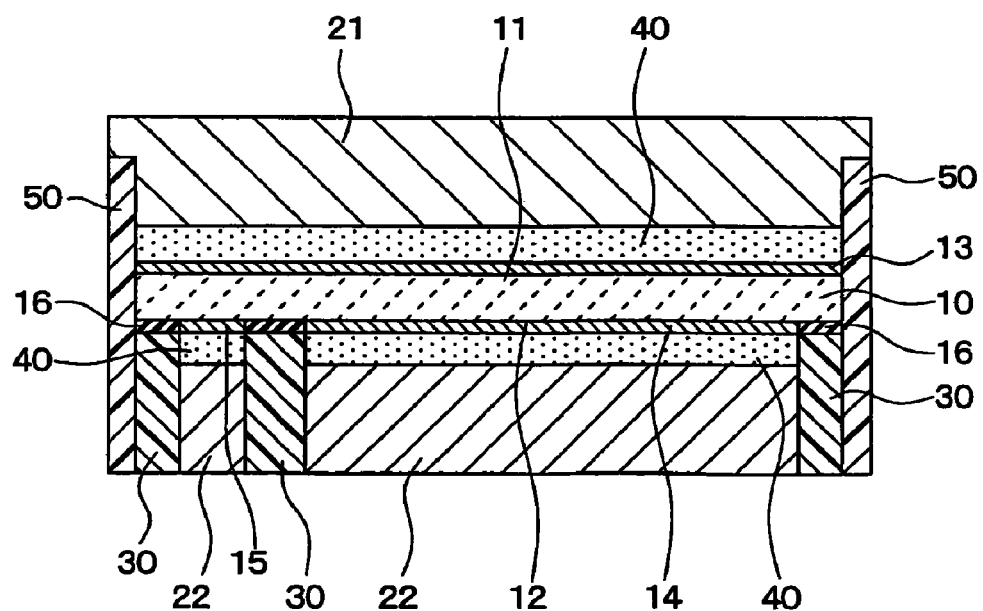

Further, FIGS. 23A and 23B are schematic sectional views showing a manufacturing method as another embodiment mode. This manufacturing method is a forming method of the coating resin 50 for covering the end face of the semiconductor device shown in the above FIG. 7, etc. In this case, processing is performed similarly to the manufacturing method shown in the above first embodiment mode until a dicing process.

In the dicing process, as shown in FIG. 23A, a boundary of the semiconductor element 10 is divisionally cut from the side of the rear face side metallic layer 22, and one portion of a plate member constituting the front face side metallic layer 21 is set to be left. At this time, it is necessary to perfectly cut at least the semiconductor element 10.

Thereafter, as shown in FIG. 23A, the coating resin 50 is injected and hardened in a groove formed in a portion in which one portion of the plate member is left. This coating resin 50 is then hardened. Thereafter, the portion left with respect to one portion of the plate member, and a portion of the coating resin 50 are cut along a dicing line. Thus, as shown in FIG. 23B, a semiconductor device covered with the coating resin 50 on an end face is completed.

Figure 24A:
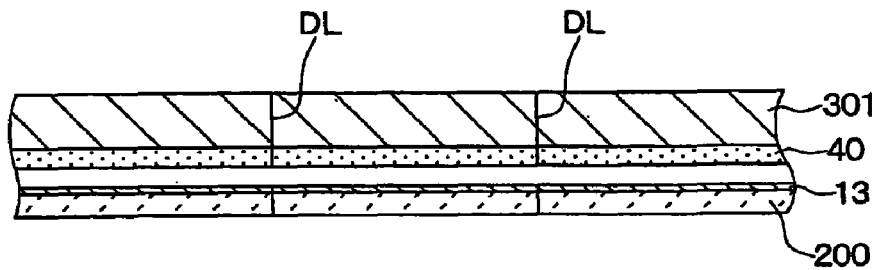
FIGS. 24A to 24C are cross sectional views showing a method for manufacturing an semiconductor device according to another modification of the first embodiment.
Figure 24B:
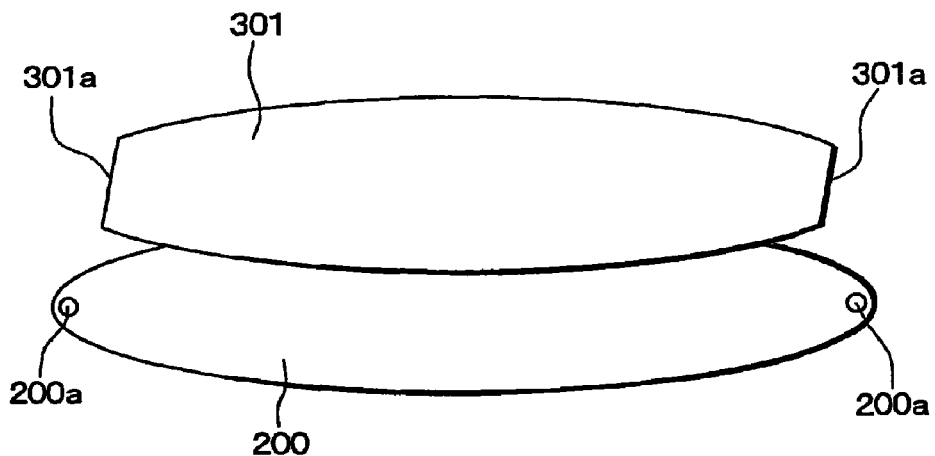
Figure 24C:
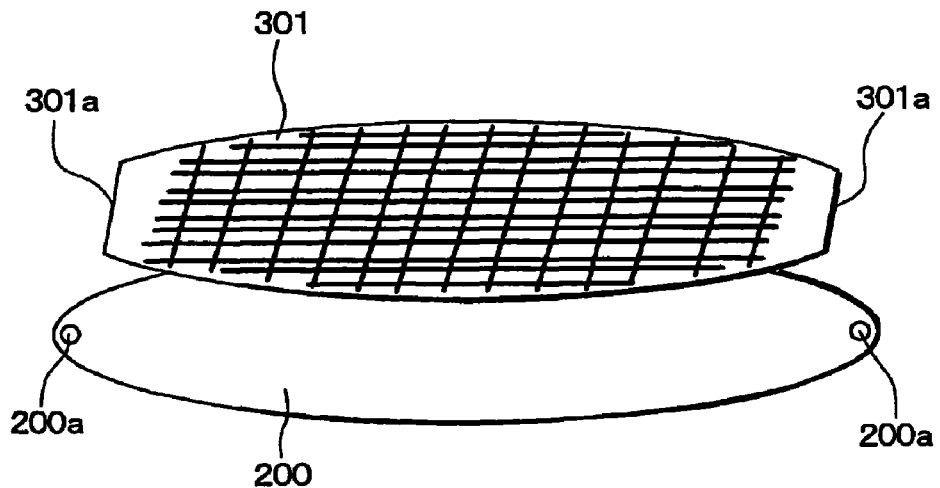

Further, FIGS. 24A to 24C are schematic sectional views showing a manufacturing method as another embodiment mode. This manufacturing method has effects in position alignment when the plate material 301 as the above metallic layer is stuck to the semiconductor wafer 200 through the solder 40, and positioning of a photo mask when the plate material 301 arranged on the wafer 200 is etched and separated by soldering or plating, etc.

As shown in FIG. 24A, the plate material 301 is position-aligned with the above semiconductor wafer 200 through the solder 40. However, at this time, as shown in FIG. 24B, a portion 301a not stuck to the semiconductor wafer 200 within the plate material 301 is arranged. Here, this portion 301a is a notch 301a.

On the other hand, a recognizing mark 200a is arranged in the portion not stuck to the plate material 301 within the semiconductor wafer 200. The plate material 301 is positioned by utilizing this recognizing mark 200a, and is soldered by reflow.

As shown in FIG. 24C, the plate material 301 arranged on the wafer 200 is next etched and separated. At this time, positioning of a photo mask is executed by utilizing the recognizing mark 200a on the above wafer 200. Thus, in the manufacturing method shown in FIGS. 24A to 24C, a work is easily made with respect to the position alignment of the plate material 301 and the semiconductor wafer 200, and the positioning of the above photo mask.

In FIGS. 24A to 24C, if an X-ray is utilized, the recognizing mark 200a can be confirmed by transmitting the plate material 301. Positioning can be performed without arranging a part such as the above notch 301a.

Further, as in the manufacturing method shown in the above FIGS. 3A to 3D and FIGS. 4A to 4C, with respect to a structure for forming the concave portion 22a in the plate material 302 in advance by half etching, etc., detailed position alignment can be automatically performed if a self alignment property of solder is utilized in the position alignment of the plate material 302 and the semiconductor wafer 200.

Further, in each of the above embodiment modes, the semiconductor element 10 has the electrodes 13 to 15 on both the front and rear faces 11, 12 thereof. The number of electrodes 13 of the front face 11 side is one, and the number of electrodes 14, 15 of the rear face 12 side is plural.

Here, the number of electrodes of each of both the front and rear faces 11, 12 may be one as the semiconductor element 10, and may be also plural.

In these cases, the metallic layers 21, 22 of the respective faces may also have a shape corresponding to an arranging pattern of the corresponding electrode. When the metallic layer is constructed by plural dividing portions, a portion between the dividing portions may be sealed by the above seal resin 30.

Further, when both the electrodes of both the front and rear faces 11, 12 of the semiconductor element 10 are one electrode, for example, both the metallic layers 21, 22 are provided as shown in the above FIG. 2A. Therefore, in this case, the seal resin 30 may be also constructed so as to be omitted.

Further, an element constructed by a semiconductor and having the electrode on at least one face of both the front and rear faces 11, 12 may be used as the semiconductor element 10. In the above embodiment mode, the electrodes 13 to 15 are arranged on both the front and rear faces 11, 12. However, a semiconductor element of a one face electrode construction having the electrode on only the front face 11, or only the rear face 12 may be also used.

In the case of such a one face electrode construction, one electrode of its one face may be used and plural electrodes of its one face may be also used. Further, in the case of this one face electrode construction, the metallic layer connected to the face of the semiconductor element having no electrode can be set to play a role of heat radiation of the semiconductor element, etc. Further, it is effective to restrain a warp of the semiconductor element by arranging the metallic layers on both the front and rear faces of the semiconductor element in comparison with a case in which the metallic layer is arranged on only one face.

In the case of this one face electrode construction, it is also possible to manufacture a semiconductor device in which both the front and rear faces of the semiconductor element are nipped by the metallic layers, and the electrode can be taken out of the metallic layer of the electrode side by preparing a semiconductor wafer forming plural semiconductor elements of the one face electrode construction therein, and performing e.g., the above various kinds of manufacturing methods.

Further, in the manufacturing method in the above embodiment mode, the semiconductor device is manufactured by nipping the semiconductor element 10 of a wafer state by the metallic layers 21, 22, and collectively cutting this semiconductor element 10. However, such a semiconductor device may be also manufactured by performing a process shown in the above manufacturing method such as connection of the metallic layer, etc. with respect to a semiconductor chip of one or plural units in which the semiconductor wafer is divisionally cut.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A method for manufacturing a semiconductor device comprising:
    preparing a semiconductor wafer having a plurality of semiconductor elements, wherein each semiconductor element includes at least one electrode, which is disposed on one of first and second surfaces of the semiconductor element;
    forming first and second metallic layers on first and second surfaces of the semiconductor wafer, respectively; and
    dividing the semiconductor wafer together with the first and second metallic layers into a plurality of semiconductor element chips, wherein
    the one electrode includes a plurality of electrode terminals, which provides a predetermined arrangement pattern,
    one of the first and second metallic layers is disposed on the one of the first and second surfaces,
    the one of the first and second metallic layers includes a plurality of divided portions, which provide an arrangement pattern corresponding to the predetermined arrangement pattern of the plurality of electrode terminals, and
    the forming the first and second metallic layers includes connecting the plurality of divided portions to the one of first and second surfaces,
    the method further comprising sealing a clearance between the plurality of divided portions with a resin member, wherein
    the connecting the plurality of divided portions includes:
        preparing a plate member for providing the one of the first and second metallic layers;
        forming a concavity on one surface of the plate member to provide the arrangement pattern of the plurality of divided portions, wherein the concavity does not penetrate the plate member;
        connecting the one surface of the plate member to the semiconductor wafer; and
        removing a bottom of the concavity so that the concavity is opened to the other one surface of the plate member.

2. A method for manufacturing a semiconductor device comprising:
    preparing a semiconductor wafer having a plurality of semiconductor elements, wherein each semiconductor element includes at least one electrode, which is disposed on one of first and second surfaces of the semiconductor element;
    forming first and second metallic layers on first and second surfaces of the semiconductor wafer, respectively; and
    dividing the semiconductor wafer together with the first and second metallic layers into a plurality of semiconductor element chips, wherein
    the one electrode includes a plurality of electrode terminals, which provides a predetermined arrangement pattern,
    one of the first and second metallic layers is disposed on the one of the first and second surfaces,
    the one of the first and second metallic layers includes a plurality of divided portions, which provide an arrangement pattern corresponding to the predetermined arrangement pattern of the plurality of electrode terminals, and
    the forming the first and second metallic layers includes connecting the plurality of divided portions to the one of first and second surfaces,
    the method further comprising sealing a clearance between the plurality of divided portions with a resin member, wherein
    the connecting the plurality of divided portions includes:
        fixing the plurality of divided portions to a film member integrally;
        connecting the film member together with the plurality of divided portions to the semiconductor wafer; and
        removing the film member from the plurality of divided portions.

* * * * *